(12) United States Patent
Hwang et al.

(10) Patent No.: US 9,288,011 B2
(45) Date of Patent: Mar. 15, 2016

(54) ENCODING APPARATUS AND ENCODING METHOD IN DATA COMMUNICATION SYSTEM

(71) Applicant: Samsung Electronics Co. Ltd., Suwon-si, Gyeonggi-do (KR)

(72) Inventors: Sung-Hee Hwang, Suwon-si (KR); Kyung-Mo Park, Seoul (KR); Hyun-Koo Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 72 days.

(21) Appl. No.: 13/651,928

(22) Filed: Oct. 15, 2012

(65) Prior Publication Data

US 2013/0097470 A1 Apr. 18, 2013

(30) Foreign Application Priority Data

Oct. 13, 2011 (KR) .................. 10-2011-0104870

(51) Int. Cl.
*H03M 13/00* (2006.01)
*H04L 1/00* (2006.01)
*H03M 13/27* (2006.01)
(Continued)

(52) U.S. Cl.
CPC ......... *H04L 1/0057* (2013.01); *H03M 13/2707* (2013.01); *H03M 13/35* (2013.01); *H03M 13/618* (2013.01); *H03M 13/635* (2013.01); *H03M 13/6356* (2013.01); *H03M 13/6362* (2013.01); *H03M 13/6508* (2013.01); *H03M 13/6516* (2013.01); *H04L 1/0041* (2013.01); *H03M 13/1515* (2013.01); *H03M 13/2906* (2013.01); *H03M 13/356* (2013.01)

(58) Field of Classification Search
CPC ............... H04L 1/0057; H04L 1/0041; H03M 13/2707; H03M 13/618; H03M 13/635; H03M 13/6362; H03M 13/6561; H03M 13/35; H03M 13/6356; H03M 13/6568; H03M 13/1515; H03M 13/2906; H03M 13/356
USPC .................................................. 714/776, 800
See application file for complete search history.

(56) References Cited

U.S. PATENT DOCUMENTS

2003/0207696 A1 11/2003 Willenegger et al.
2003/0226092 A1 12/2003 Kim et al.
(Continued)

FOREIGN PATENT DOCUMENTS

EP 0 719 065 A1 6/1996
WO 03/040920 A1 5/2003

OTHER PUBLICATIONS

Kanai et al.; Forward Error Correction Control on AAL 5: FEC-SSCS; XP000625702; IEEE International Conference on Communications; Jun. 23, 1996; Dallas, TX.

*Primary Examiner* — Sam Rizk
(74) *Attorney, Agent, or Firm* — Jefferson IP Law, LLP

(57) ABSTRACT

An encoding method and apparatus in a data communication system are provided. The method includes inputting a source block including a plurality of source payloads, converting the source block to an information block including a plurality of information payloads according to an Information Block Generation (IBG) mode selected from a plurality of IBG modes, transmitting a delivery block generated by adding a parity block generated by encoding the information block according to a selected encoding scheme to the source block to a receiver, and transmitting information indicating the selected IBG mode to the receiver.

24 Claims, 22 Drawing Sheets

(51) Int. Cl.
*H03M 13/35* (2006.01)
*H03M 13/15* (2006.01)
*H03M 13/29* (2006.01)

(56) References Cited

U.S. PATENT DOCUMENTS

2004/0120346 A1* 6/2004 Olsen .......................... 370/466
2005/0149821 A1 7/2005 Lee et al.
2006/0077890 A1 4/2006 Suryavanshi et al.
2006/0107187 A1 5/2006 Hannuksela
2007/0172153 A1 7/2007 Song
2008/0065965 A1* 3/2008 Hannuksela .................. 714/776
2008/0256421 A1* 10/2008 Gerstel et al. ................ 714/776
2009/0276686 A1* 11/2009 Liu et al. ...................... 714/776
2009/0327842 A1* 12/2009 Liu et al. ...................... 714/776
2011/0154161 A1 6/2011 Kim et al.

* cited by examiner

ENCODING APPARATUS AND ENCODING METHOD IN DATA COMMUNICATION SYSTEM

PRIORITY

This application claims the benefit under 35 U.S.C. §119(a) of a Korean patent application filed on Oct. 13, 2011 in the Korean Intellectual Property Office and assigned Serial No. 10-2011-0104870, the entire disclosure of which is hereby incorporated by reference.

BACKGROUND OF THE INVENTION

1. Field of the Invention

The present invention relates to a data communication system. More particularly, the present invention relates to a variable-size packet Forward Error Correction (FEC) encoding apparatus and method.

2. Description of the Related Art

According to diversification of contents and increases in large-capacity contents such as High Definition (HD) contents and Ultra High Definition (UHD) contents communicated via a data communication network, data congestion has become an increasingly serious issue. Due to such a condition, contents transmitted by a transmitter are not completely transferred to a receiver, and some of the contents are lost en route.

In general, data is transmitted by the unit of packets, and accordingly data loss occurs in the unit of transport packets. Accordingly, when the transport packet is lost in a network, the receiver does not receive the lost transport packet, and thus cannot know the data within the lost transport packet. As a result, user inconvenience in various forms occurs, such as audio signal quality deterioration, video picture quality deterioration, video picture break, caption omission, file loss and the like.

In a technology for recovering data lost in the network, a parity block by a Forward Error Correction (FEC) encoding may be added to a source block including a predetermined number of packets and then transmitted. In general, a size (or length) of data transmitted within the packet (that is, source payload) may have a fixed packet size or a variable packet size. For example, a Moving Picture Experts Group2 (MPEG2) Transport Stream (TS) has a fixed packet size of 188 bytes including a header of 4 bytes and a payload of 184 bytes, but sizes of transport packets are not always the same in a Real-Time Transport Protocol (RTP) or a protocol such as MPEG Media Transport (MMT).

When the variable packet size is applied, the transmitter may add padding data to the data to make sizes of actually transmitted packet data the same and then encode the data. However, in this case, an Application Layer (AL)-FEC (AL-FEC) efficiency is deteriorated due to the addition of the padding data. Further, since the inefficiency increases as amounts of the padding data are larger, a method of configuring an efficient source block in data communication to which the variable packet size is applied and an AL-FEC encoding according to the method are desired.

SUMMARY OF THE INVENTION

Aspects of the present invention are to address at least the above-mentioned problems and/or disadvantages and to provide at least the advantages described below. Accordingly, an aspect of the present invention is to provide an Application Layer-Forward Error Correction (AL-FEC) encoding apparatus and method for data having a variable packet size.

Another aspect of the present invention is to provide an apparatus and a method for arranging source payloads having a variable size on a two-dimensional array and configuring an information block to be encoded.

Another aspect of the present invention is to provide an apparatus and a method for signaling and recovering lengths of source payloads arranged on the two-dimensional array within the information block to be encoded.

Another aspect of the present invention is to provide an encoding apparatus and method for detecting a position of each packet within the information block to be encoded.

In accordance with an aspect of the present invention, an encoding method in a data communication system is provided. The method includes inputting a source block including a plurality of source payloads, converting the source block to an information block including a plurality of information payloads according to an Information Block Generation (IBG) mode selected from a plurality of IBG modes, transmitting a delivery block generated by adding a parity block generated by encoding the information block according to a selected encoding scheme to the source block to a receiver, and transmitting information indicating the selected IBG mode to the receiver.

In accordance with another aspect of the present invention, an encoding apparatus in a data communication system is provided. The apparatus includes a converter for receiving a source block including a plurality of source payloads, and for converting the source block to an information block including a plurality of information payloads according to an IBG mode selected from a plurality of IBG modes, an encoder for encoding the information block according to a selected encoding scheme to generate a parity block, and a transmitter for transmitting a delivery block generated by adding the parity block to the source block to a receiver, and for transmitting information indicating the selected IBG mode to the receiver.

In accordance with another aspect of the present invention, a decoding method in a data communication system is provided. The method includes receiving a delivery block including a source block including a plurality of source payloads and a parity block generated from the source block from a transmitter, receiving information indicating a selected IBG mode from the transmitter, converting the source block to an information block including a plurality of information payloads according to an IBG mode selected from a plurality of IBG modes, and decoding the information block and the parity block to recover lost source payloads included in the information block.

In accordance with another aspect of the present invention, a decoding apparatus in a data communication system is provided. The apparatus includes a receiver for receiving a delivery block including a source block including a plurality of source payloads and a parity block generated from the source block, and for receiving information indicating a selected IBG mode from a transmitter, a converter for converting the source block to an information block including a plurality of information payloads according to an IBG mode selected from a plurality of IBG modes, and a decoder for decoding the information block and the parity block to recover lost source payloads included in the information block.

According to the present invention, it is possible to efficiently operate AL-FEC and also improve a data transmission efficiency in an environment where data having a variable packet size is transmitted/received.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
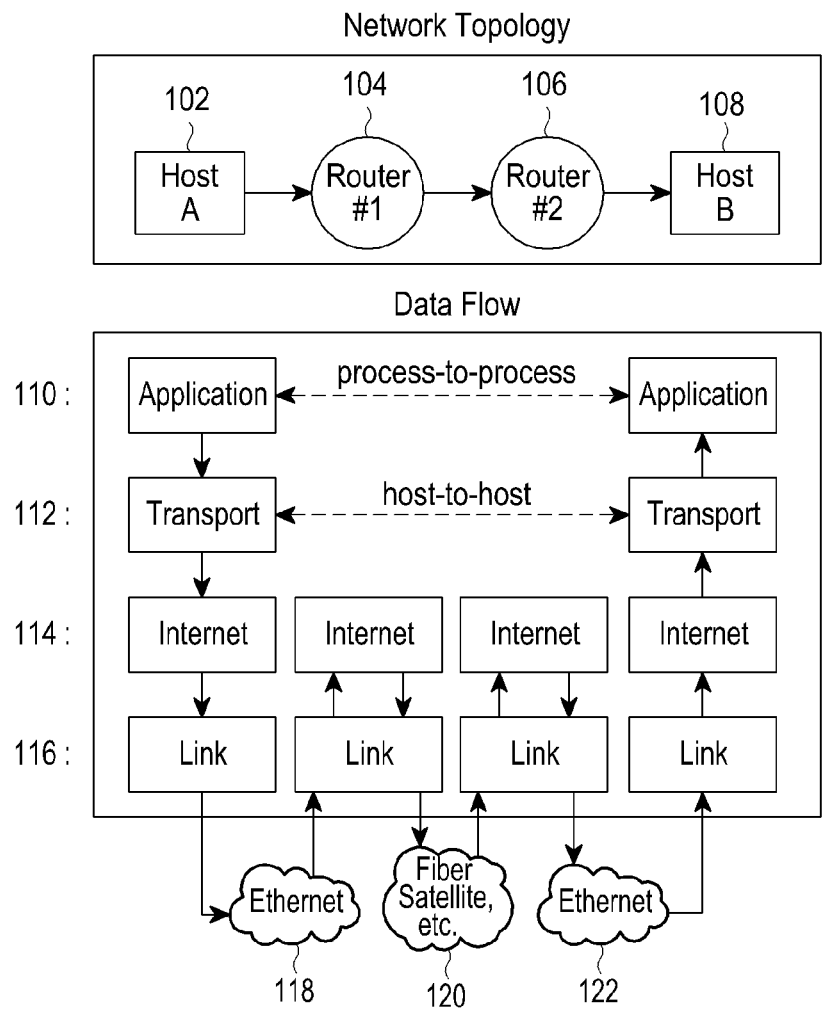
FIGS. 1A and 1B illustrate a network topology and a data flow in a communication system according to an exemplary embodiment of the present invention.
Figure 1B:
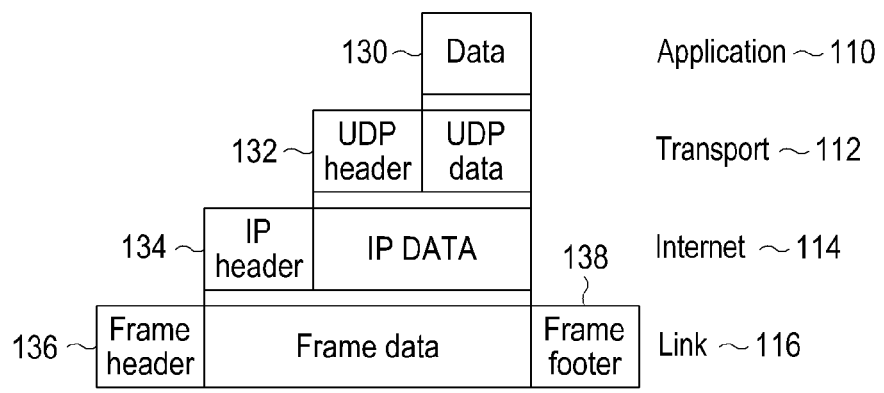

FIGS. 1A and 1B illustrate a network topology and a data flow in a communication system according to an exemplary embodiment of the present invention.

Referring to FIG. 1A, the network topology includes a host A 102 operating as an transmitter and a host B 108 operating as a receiver, and the host A 102 and the host B 108 are connected through one or more routers 104 and 106. The host A 102 and the host B 108 are connected with the routers 104 and 106 through Ethernets 118 and 122, and the routers 104 and 106 may be connected to each other through an optical fiber, satellite communication, or another available means 120. A data flow between the host A 102 and the host B 108 is generated through a link layer 116, an Internet layer 114, a transport layer 112, and an application layer 110.

Referring to FIG. 1B, the application layer 110 generates data 130 desired to be transmitted, through Application Layer-Forward Error Correction (AL-FEC). The data 130 may be Real-Time Transport Protocol (RTP) packet data divided from data compressed by an Audio/Video (AV) codec terminal by using RTP or Moving Picture Experts Group (MPEG) Media Transport (MMT) packet data according to MMT. The data 130 is converted to a User Datagram Protocol (UDP) packet 132 in which a UDP header is inserted by the transport layer 112 as an example. The Internet layer 114 adds an Internet Protocol (IP) header to the UDP packet 132 to generate the IP packet 134, and the link layer 116 adds a frame header 136, and a frame footer 138 as necessary to the IP packet 134 to configure the frame 116 desired to be transmitted.

When compression by the unit of frames is applied to a data communication system, the frame is divided into a plurality of packets having the same length, and it is required to pad only a last packet. However, when the frame is divided into a plurality of slices including video packets and encoded by the unit of slices, respective slices may have different sizes, so that a relatively large amount of padding is generated. Particularly, when various types of packets such as a video packet, an audio packet, a text packet and the like are transmitted to the same stream and an AL-FEC encoding is applied, different types of packets have different sizes, so that a large amount of padding may be generated. Further, in a scalable video encoding, sizes of packets may be different for each layer, so that a large amount padding is generated.

In exemplary embodiments of the present invention described below, when an amount of data transmitted through a transport protocol is variable, e.g., when the data has a variable packet size, an efficient AL-FEC encoding is performed.

Figure 2:
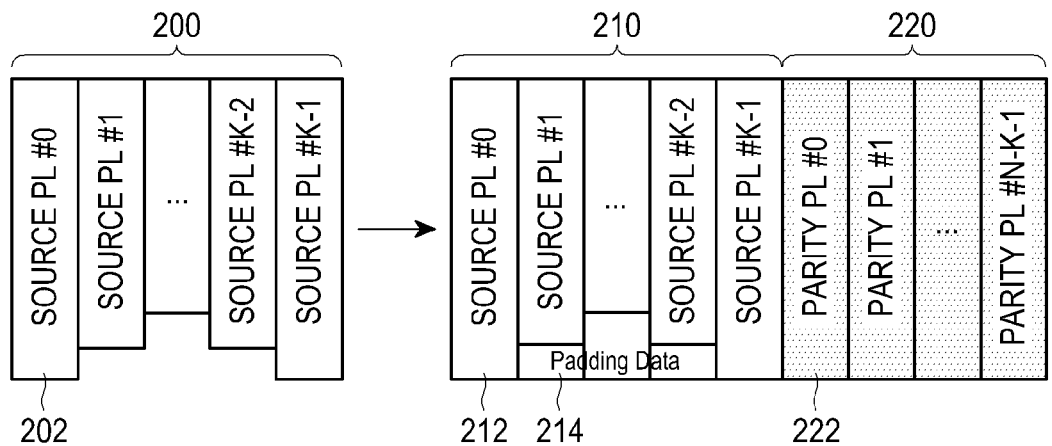
FIG. 2 illustrates information block generation for an Application Layer-Forward Error Correction (AL-FEC) encoding according to an exemplary embodiment of the present invention.

FIG. 2 illustrates Information Block Generation (IBG) for the AL-FEC encoding according to an exemplary embodiment of the present invention.

Referring to FIG. 2, when source block 200 including K source payloads 202 having a variable packet size, e.g., source PL #0 to source PL #K−1 is input for the AL-FEC encoding, a transmitter adds padding data 214 to at least some of the source payloads in order to make the source payloads equally have a length of S (for example, $S=S_{max}$) to configure information payloads 212 having the same length. Here, $S_{max}$ refers to a maximum length among the sizes of the source payloads. The information payloads 212 configure an information block 210. An FEC encoder within the transmitter encodes the information block 210 according to a given FEC code, and generates parity payloads 222 corresponding to the information payloads 212, e.g., parity PL #0 to parity PL #N−K−1. The N−K parity payloads 222 configure a parity block 220. The transmitter transmits the source block 200 and the parity block 220 in a form of packets. For example, payloads of the source block 200 and the parity block 220 are carried on packets and then transferred.

In an IBG mode of FIG. 2, for example, when a total amount of the padding data 214 corresponds to a size of the information block 210 after the padding, e.g., 50% of $S_{max}×$ K, 50% of the parity block 220 is added for the padding data, so that unnecessary transmission is generated. Since payloads recovered after an FEC decoding include the padding data, it is required to notify a receiver of actual lengths of the source payloads. When packet loss is generated in an application channel environment, a corresponding payload itself is lost, and thus a length of data stored in the payload cannot be known, unlike a physical channel.

Figure 3:
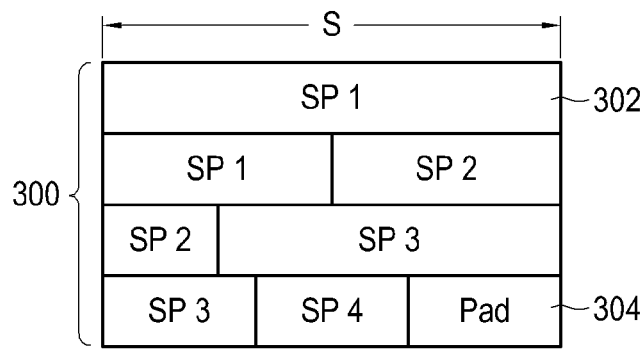
FIG. 3 illustrates information block generation of a two-dimensional array for an AL-FEC encoding according to another exemplary embodiment of the present invention.
Figure 4:
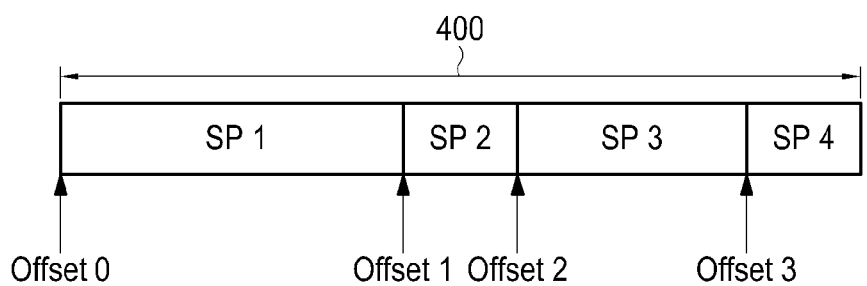
FIG. 4 illustrates an offset of each payload in a two-dimensional array for an AL-FEC block according to an exemplary embodiment of the present invention.

In FIGS. 3 and 4 below, a 2-Dimensional array (2D array) will be described to address the above-mentioned problems.

FIG. 3 illustrates an IBG of a two-dimensional array for an AL-FEC encoding according to an exemplary embodiment of the present invention.

Referring to FIG. 3, input source packets 302 including SP1 to SP4 are arranged within a two-dimensional array 300 having a predetermined horizontal length of S in an order according to a predetermined rule. Specifically, SP1 having a relatively long length is arranged in an entire part in a first row of the two-dimensional array 300 and some of a front part in a second row, SP2 is arranged in some of a rear part in the second row and some of a front part in a third row, SP3 is arranged in some of a rear part in the third row and some of a front part in a fourth row, and SP4 having a relatively short length is arranged in a center of the fourth row. Padding data 304 fills the remaining parts of the two-dimensional array 300 other than the parts where the source packets 302 are arranged.

Each row of the information block including the above two-dimensional array 300 is the information payload, so that K corresponding to the number of information payloads may be smaller than K' corresponding to the number of source payloads. The FEC encoder encodes the information block including the two-dimensional array 300 to generate parity payloads. The IBG mode using such a two-dimensional array 300 reduces the number of information payloads in comparison with the IBG mode of FIG. 2, and accordingly reduces an amount of parity payloads.

FIG. 4 illustrates an offset of each payload in a two-dimensional array for an AL-FEC block according to an exemplary embodiment of the present invention.

Referring to FIG. 4, offset information indicating a start position of each source packet on a serialized two-dimensional array 400 is transmitted together with the source block. In an illustrated example, the offset information includes offset0, offset1, offset2, and offset3. An AL-FEC decoder reconfigures the two-dimensional array 400 from the offset of each source packet to perform a decoding.

The two-dimensional array for the AL-FEC block illustrated in FIGS. 3 and 4 generates an additional signaling overhead since offset information of each packet should be informed to the receiver. Accordingly, a technology for improving an AL-FEC efficiency while minimizing the signaling overhead in a variable packet size environment is desired.

As illustrated in FIGS. 3 and 4, the offset information on the two-dimensional array for the AL-FEC block may be expressed by a (x, y) coordinate. When a payload size of the transmitted packet is limited by a Maximum Transfer Unit (MTU), for example, 1500 bytes and high speed and high capacity data such as full High Definition (HD), 3-Dimensional (3D), or ultra high definition data is transmitted, the number of packets stored in the two-dimensional array within AL-FEC block duration of 200 ms is hundreds to thousands. Accordingly, the offset information requires 3 to 4 bytes per packet. Therefore, the parity data (hereinafter, referred to as length parity data) generated by encoding a length of each packet may be transmitted instead of transmission of the offset information. 2 bytes are sufficient for information on the length of each packet with respect to the MTU size of 1500 bytes. Accordingly, an amount of the length parity data is calculated as 2 bytes×(1−code rate) from a viewpoint of the overhead required per packet. When the code rate is 50%, the amount of the length parity data is 1 byte per packet.

Accordingly, the FEC encoder encodes the information on the length of each packet according to the IBG mode of FIG.

3 to generate the length parity data, and transmits the length parity data together with the source block and the parity block.

As another exemplary embodiment of the present invention, the FEC encoder may select and use one of the IBG mode of FIG. 2 and the IBG mode of FIG. 3. This is because the IBG mode according to FIG. 3 does not always guarantee a high efficiency in comparison with the IBG mode of FIG. 2. This will be described below in more detail.

When the IBG mode of FIG. 2 is applied, the AL-FEC decoder outputs actual data (e.g., source payloads) except for padding data among recovered information payloads to a higher layer. To this end, the AL-FEC should know an actual data size of each information payload (e.g., payload sizes). The AL-FEC decoder receives length parity data for the actual data size of each payload from the transmitter, and may obtain the actual data size of each payload based on the length parity data. On the other hand, when the source payloads are configured to have the two-dimensional array as illustrated in FIG. 3, the AL-FEC decoder may recover the source block by replacing each received payload in the two-dimensional array by using the offset information for each received payload. In general, since the number of packets lost in the mode of FIG. 2 is larger than the number of payloads lost in the two-dimensional array of FIG. 3, a ratio of the length parity data required for the IBG mode of FIG. 2 should be higher than a ratio of the length parity data for the two-dimensional array.

Since the mode of FIG. 3 requires a larger amount of length parity data in comparison with the mode of FIG. 2, the IBG mode of FIG. 3 is more efficient when the amount of the further required parity data is smaller than the amount of the padding reduced by the configuration of the two-dimensional array. Accordingly, the FEC encoder may select one of the IBG mode of FIG. 2 and the IBG mode of FIG. 3 in consideration of the amount of the parity payloads reduced by the IBG mode of FIG. 3 and the amount of the length parity data additionally required by the IBG mode of FIG. 3.

For example, when the information block configured to have the two-dimensional array shown in FIG. 3 less generates one parity payload in comparison with the information block configured as shown in FIG. 2, the FEC encoder applies the IBG mode of FIG. 2 when the amount of added length parity data by the two-dimensional array is larger than a size of one parity payload. Otherwise, the FEC encoder applies the IBG mode of FIG. 3.

As another exemplary embodiment of the present invention, the FEC encoder may select one of the IBG mode of FIG. 2 and the IBG mode of FIG. 3 according to the amount of padding data simply required due to the IBG mode of FIG. 2. In general, amounts of signaling information required for the IBG mode of FIG. 2 and the IBG mode of FIG. 3 are almost predetermined. Accordingly, it is determined which one of the IBG mode of FIG. 2 and the IBG mode of FIG. 3 is more efficient according to the amount of the padding data required due to the IBG mode of FIG. 2. That is, the IBG mode of FIG. 2 is more efficient as the amount of the padding data is smaller, and the IBG mode of FIG. 3 is more efficient as the amount of the padding data is larger. Accordingly, when the amount of the padding data additionally required due to the IBG mode of FIG. 2 is larger than a predetermined threshold, the FEC encoder configures the information block by using the IBG mode of FIG. 3. Otherwise, the FEC encoder configures the information block by using the IBG mode of FIG. 2. For example, the threshold may be determined according to a difference between amounts of signaling information required for the IBG mode of FIG. 2 and the IBG mode of FIG. 3.

Figure 5A:
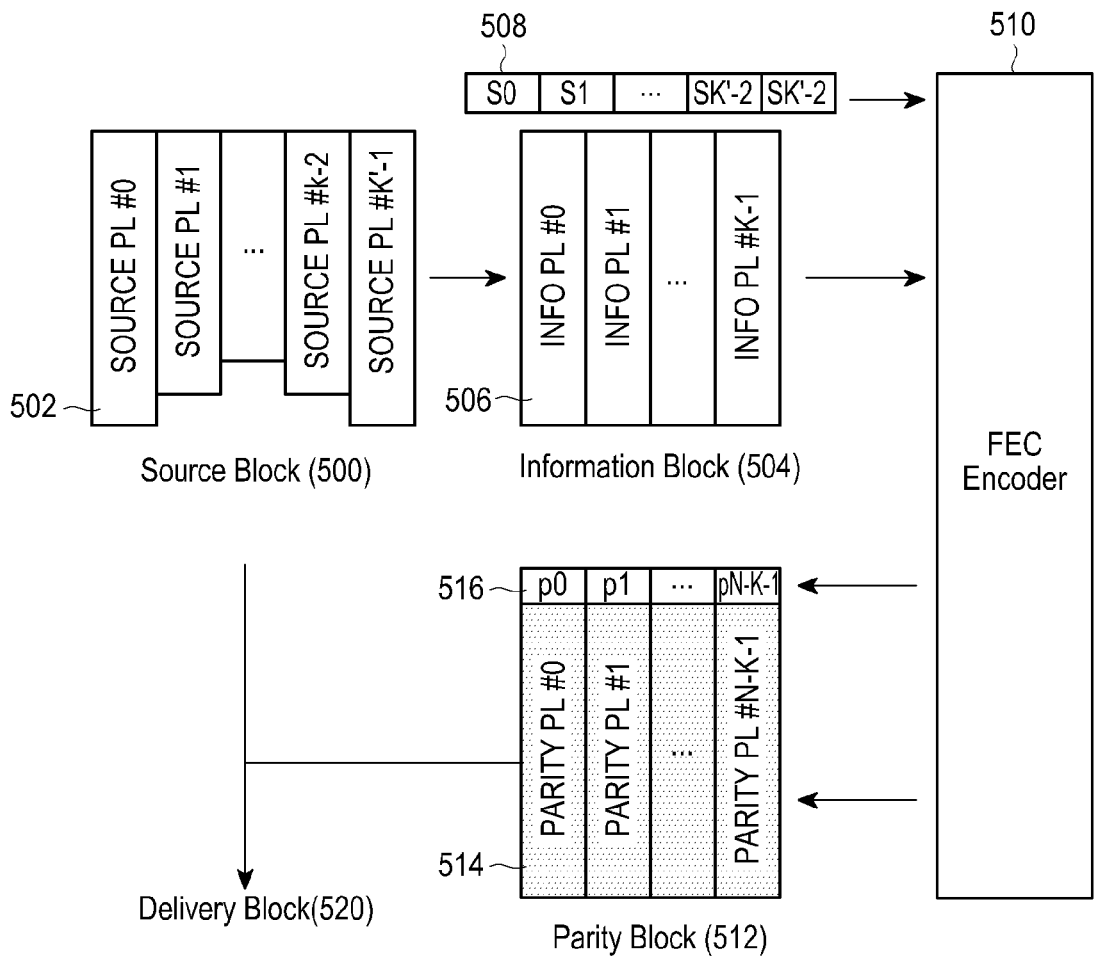
FIG. 5A illustrates an AL-FEC encoding process according to an exemplary embodiment of the present invention.

FIG. 5A illustrates an AL-FEC encoding process according to an exemplary embodiment of the present invention.

Referring to FIG. 5A, a source block 500 including K' source payloads 502 having a variable length is input for the AL-FEC encoding. The source payloads 502 are sequentially arranged on an information block 504 of the two-dimensional array including K information payloads 506 having the same length. A last information payload may include padding data after the remaining of the serialized source payloads. The transmitter configures a source block 508 for source payload lengths (referred to as a "length source block") including payload lengths for the source payloads 502 within the source block 500, such as S0, S1, . . . , SK'−2, and SK'−1. An FEC encoder 510 encodes the information block 504 to generate a parity block 512 including (N−K) parity payloads 514 having the same length, and also encodes the length source block 508 to generate a parity block 516 including p0, p1, . . . , pN−K−1. The length parity block 516 and the parity block 512 are configured by the source block 500 and an FEC delivery block 520, and are transmitted to the receiver from the transmitter.

Figure 5B:
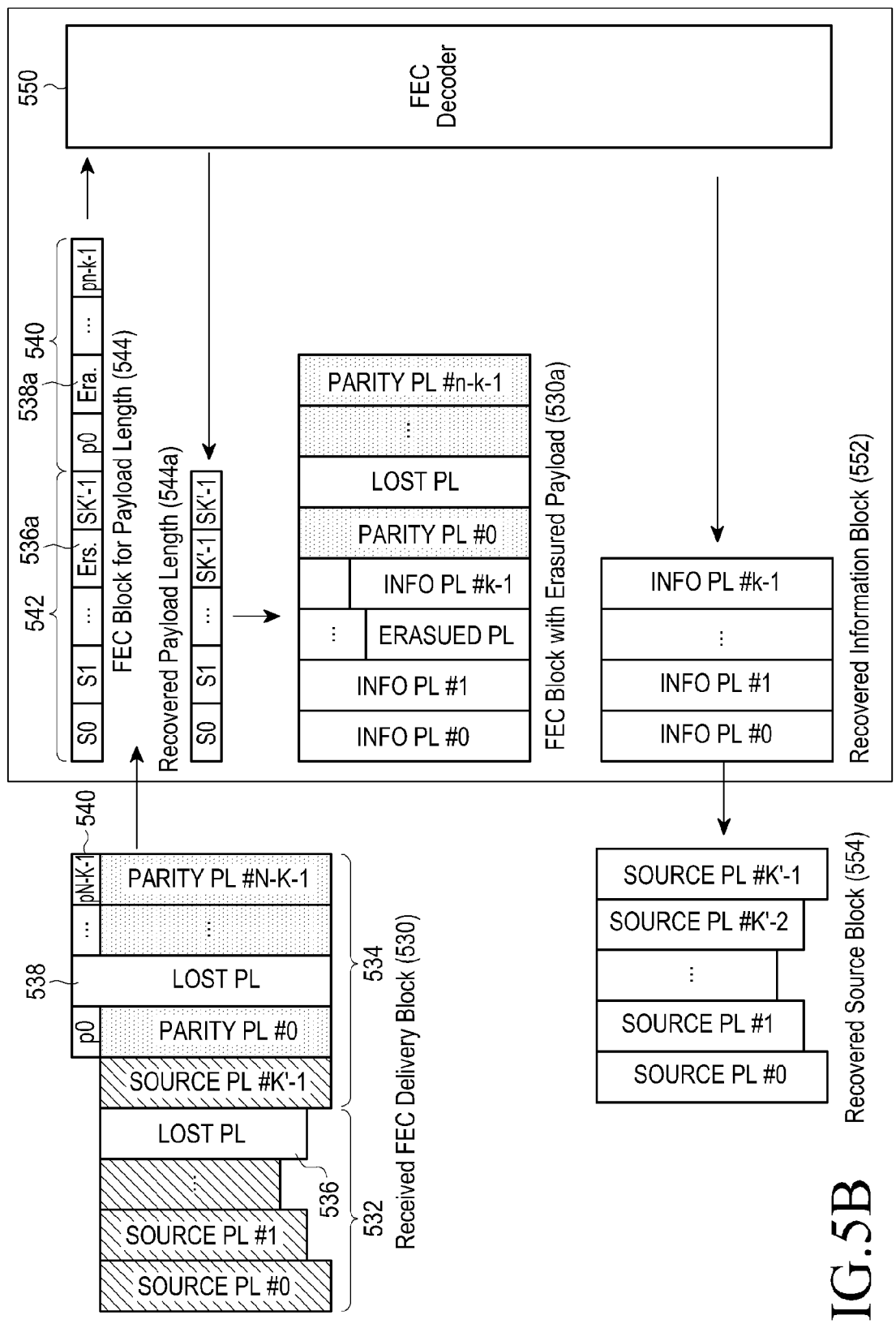
FIG. 5B illustrates an AL-FEC decoding process according to an exemplary embodiment of the present invention.

FIG. 5B illustrates an AL-FEC decoding process according to an exemplary embodiment of the present invention.

Referring to FIG. 5B, an FEC delivery block 530 is received by the receiver from the transmitter. The FEC delivery block 530 includes source payloads 532, parity payloads 534, and length parity data 540. Due to packet loss channel characteristics, there may exist one or more lost payloads 536 and 538 within the received FEC delivery block 530.

The receiver first counts corresponding lengths S0, S1, . . . , SK'−1 542 from the successfully received source payloads 532. Since the source payloads 532 are transmitted through a protocol layer based on an IP protocol, the IP protocol can discriminate respective IP packets carrying respective payloads of the FEC delivery block 520. The receiver identifies a boundary of each payload of the received FEC delivery block 530 from the discrimination between the IP packets, and counts each of the successfully received payload lengths. As another example, the receiver can obtain each of the received payload lengths through an application protocol such as MMT or RTP, a Transmission Control Protocol (TCP), or a transport protocol such as a UDP. As still another example, although not illustrated, the transmitter adds a header containing a length field to each payload (or each source payload) of the FEC delivery block 520 and then transmits the payload, and the receiver can know the length from the header of the received payload.

The receiver configures an FEC block for payload length 544 including the length block 542 including lengths of the source payloads 532 and the length parity data 540 extracted from the FEC delivery block 520. A length 536a of the lost source payload 536 and length parity data 538a of the lost parity payload 538 within the FEC block 544 are erased, for example, take predetermined values. An FEC decoder 550 performs an erasure decoding for the FEC block 544, and recovers lengths 544a of all payloads including the lost payloads 536 and 538.

Since the receiver can know a position of each payload on an information block 552 configured to have the two-dimensional array from the recovered payload lengths 544a, the receiver arranges the received payloads 532 and 534 on the two-dimensional array and erases the lost payloads 536 and 538 to configure an FEC block 530a. Spaces occupied by the lost payloads 536 and 538 within the FEC block 530a may be known from the recovered payload lengths 544a. The FEC decoder 550 decodes the FEC block 530a to recover the information block 552, and outputs the source block 554 from the recovered information block 552 based on the recovered payload lengths 544a.

Figure 6A:
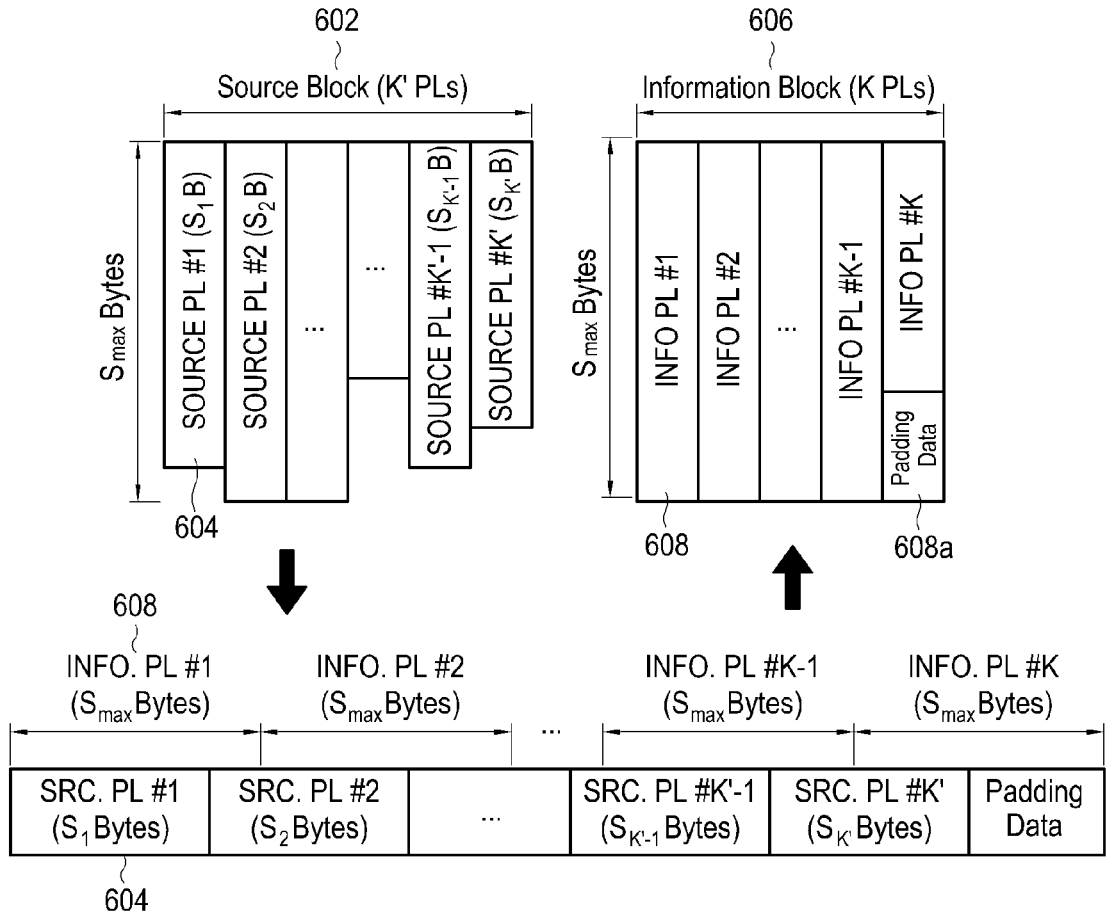
FIG. 6A illustrates a process of generating an information block from a source block according to an exemplary embodiment of the present invention.

FIG. 6A illustrates a process of generating an information block from a source block according to an exemplary embodiment of the present invention.

Referring to FIG. 6A, a source block 602 includes K' source payloads 604, and an information block 606 includes K information payloads 608 configured by arranging source payloads 604 on the two-dimensional array and selectively padding data 608a (here, K<K'). Sizes S1, S2, . . . SK'−1, and SK' of the source payloads 604 may be determined in consideration of the MTU and various header fields used for transmission. When a maximum size of the source payloads is $S_{max}$ bytes and a size of the two-dimensional array desired to be configured is $S_{max} \times K$, the source block 602 including K' source payloads is configured by a series of the input source payloads 604. The source payloads 604 within the configured source block 602 are sequentially arranged on the two-dimensional array having the $S_{max} \times K$ size, and the padding data 608a is added to a last part of a last Kth information payload as necessary, which finally generates the information block 606.

In a different description, K' source payloads are serialized, and extra bytes are padded to end of the serialized source payloads. Each $S_{max}$ bytes of the serialized source payloads becomes each information payload, and the last information payload is generated by adding padding data to the remaining of the serialized source payloads. At this time, a size of the padding data is determined such that a total size of the information block becomes a multiple of $S_{max}$ bytes. That is, the information block is generated by converting in parallel all information payloads by the unit of $S_{max}$, and K corresponding to the number of information payloads generated as described above may be smaller than K'.

Figure 6B:
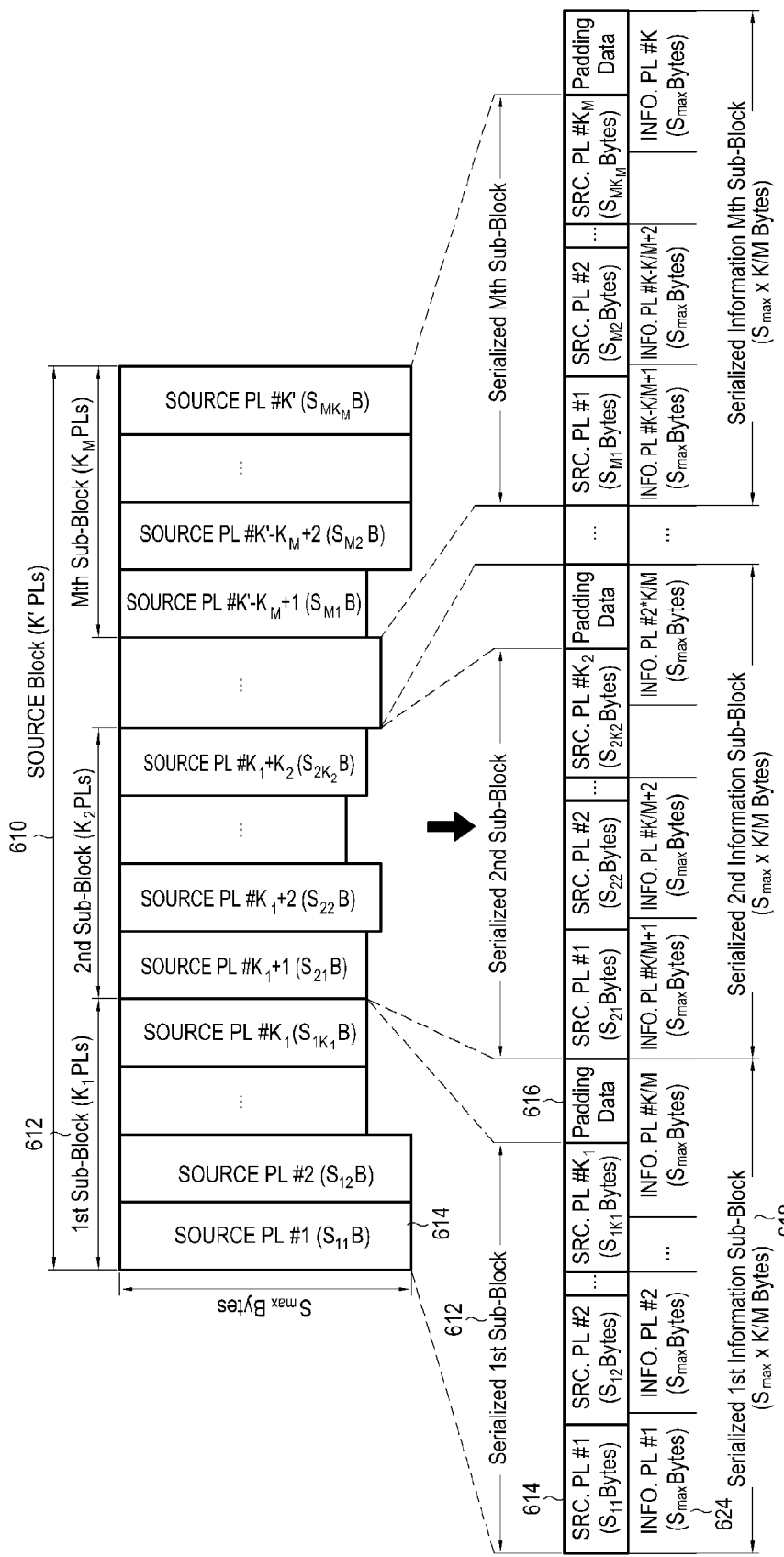
FIGS. 6B and 6C illustrate a process of generating an information block from a source block according to another exemplary embodiment of the present invention.
Figure 6C:
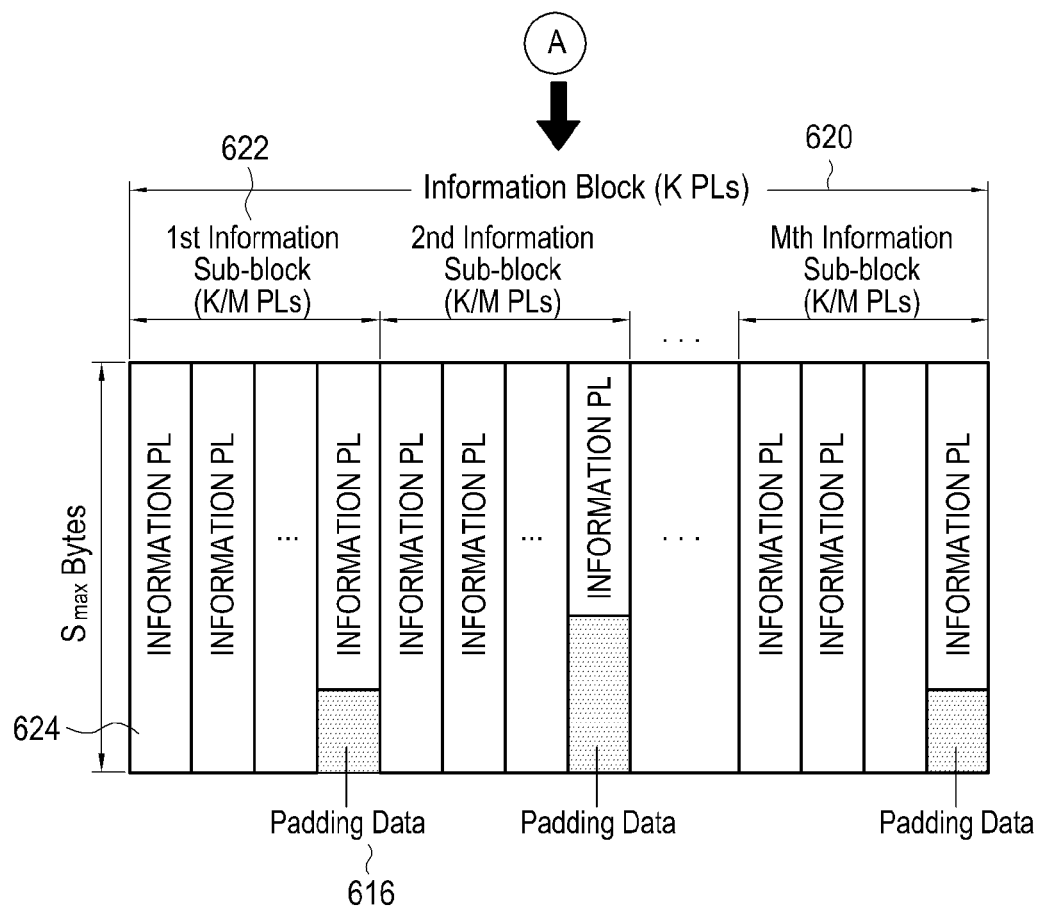

FIGS. 6B and 6C illustrate a process of generating an information block from a source block according to another exemplary embodiment of the present invention. Here, a source block 610 includes a plurality of sub-blocks 612.

Referring to FIG. 6B, the source block 610 is divided into M sub-blocks 612, and each of the sub-blocks 612 includes $K_1, K_2, \ldots K_M$ source payloads 614 ($K'=K_1+K_2+\ldots K_M$). Here, $K_1, K_2, \ldots K_M$ are positive integers equal to or larger than "1". Each sub-block 612 starts to be arranged in a pre-designated position on the two-dimensional array, for example, every $S_{max} \times K/M$ byte point. The pre-designated positions are start points of information sub-blocks 618 having fixed sizes of $S_{max} \times K/M$, and the remaining parts of the information sub-blocks 618 after the sub-blocks 612 are arranged are occupied by padding data 616 as necessary. Each information sub-block 618 is divided into K/M information payloads 624 having $S_{max}$.

Referring to FIG. 6C, an information block 620 may be configured by sequentially arranging the information payloads 624 on the two-dimensional array having a size of $S_{max} \times K$. The K information payloads 624 included in the information block 620 have an equal size to $S_{max}$. Unlike the exemplary embodiment of FIGS. 5A and 5B, the padding data 616 may be shown among the serialized information block 620.

In a different description, $K_i$ source payloads of an ith sub-block are serialized, and j-th $S_{max}$ bytes of the serialized source payloads become a j-th information payload of the i-th information sub-block 622. The last information payload of the i-th information sub-block 622 is generated by adding padding data to the remaining of the $K_i$ serialized source payloads. At this time, a size of the padding data is determined such that a total size of the ith information sub-block 622 becomes $S_{max} \times K/M$. That is, only the last information payload may include the padding data within each information sub-block.

Figure 7:
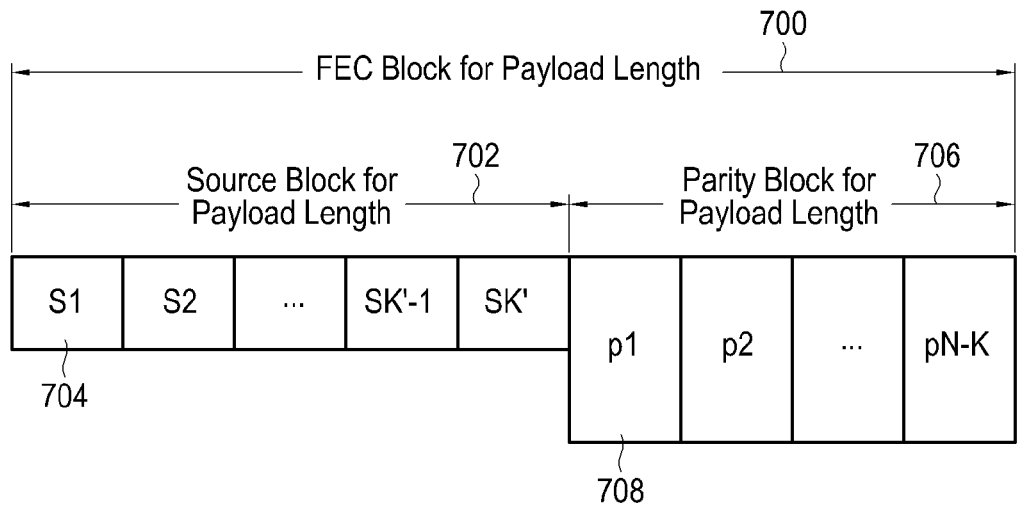
FIG. 7 illustrates a configuration of an Forward Error Correction (FEC) block for payload length according to an exemplary embodiment of the present invention.

FIG. 7 illustrates a configuration of an FEC block for payload length according to an exemplary embodiment of the present invention.

Referring to FIG. 7, an FEC encoder generates a parity block for payload length 706 by FEC-encoding a source block for payload length 702 including lengths Si 704 (i=1, 2, . . . , K') for K' source payloads. The parity block 706 includes (N−K) parity data 708. An FEC block for payload length 700 includes the source block 702 and the parity block 706. As described above, it is preferable that the parity data for payload length is generated by a higher (that is, more robust) code rate than that of the parity data for source payload.

For example, the FEC encoder can generate the parity block including 2×(N−K) parity data by generating (N−K) parity data from odd-numbered lengths of the payload lengths and separately generating (N−K) parity data from even-numbered lengths. As another exemplary embodiment of the present invention, the FEC encoder can configure the parity block for payload length by generating 2×(N−K) parity data from the payload lengths. Accordingly, the FEC block for payload length (referred to as a "length FEC block") guarantees a better decoding capability than that of the FEC block for source payload (referred to as an "information FEC block").

Figure 8A:
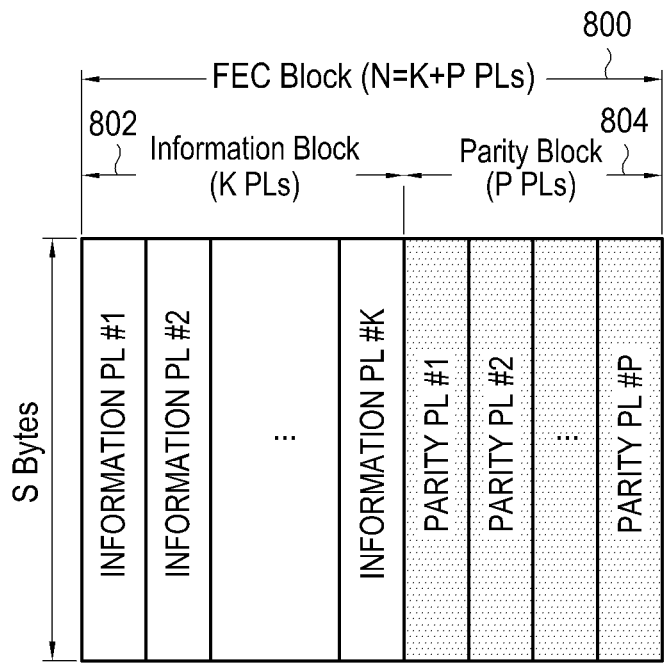
FIGS. 8A and 8B illustrate configurations of an information FEC block and an FEC delivery block according to an exemplary embodiment of the present invention.
Figure 8B:
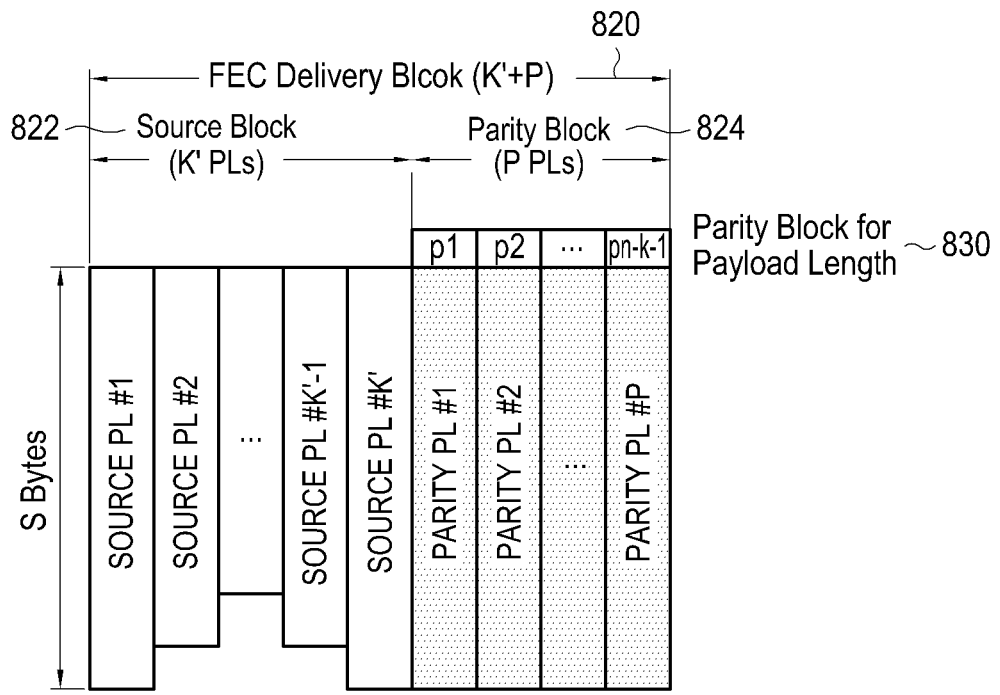

FIGS. 8A and 8B illustrate configurations of an information FEC block and an FEC delivery block according to an exemplary embodiment of the present invention.

Referring to FIG. 8A, an information FEC block 800 includes an information block 802 including K information payloads and a parity block 804 including P parity payloads. Each payload has a size of S bytes (for example, $S=S_{max}$). The FEC encoder configures the FEC block 800 by generating the parity block 804 from the information block 802. Referring to FIG. 8B, the FEC delivery block 820 includes a source block 822 including K' source payloads, a parity block 824 including P parity payloads, and a parity block for payload length 830.

Figure 8C:
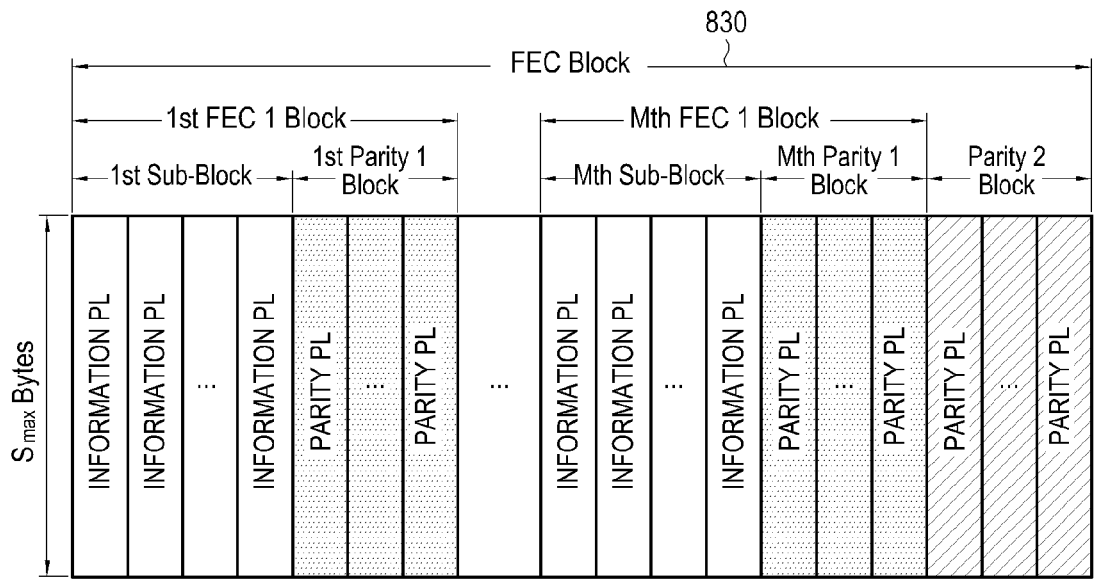
FIGS. 8C and 8D illustrate configurations of an information FEC block and an FEC delivery block according to another exemplary embodiment of the present invention.
Figure 8D:
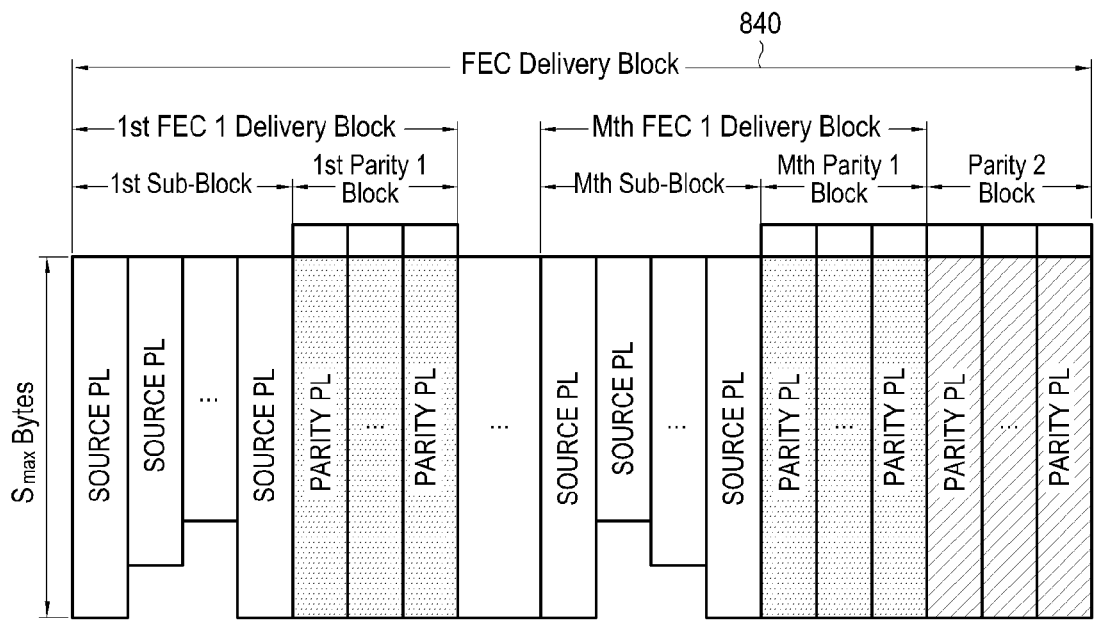

FIGS. 8C and 8D illustrate configurations of an FEC block and an FEC delivery block according to another exemplary embodiment of the present invention. Here, an example where 2 stage FEC is performed is illustrated.

Referring to FIG. 8C, an information FEC block 830 includes M FEC #1 blocks configured for a first FEC and parity #2 blocks generated through a second FEC. Each FEC #1 block includes a sub-block including a plurality of information payloads and a parity #1 block generated through the first FEC. Referring to FIG. 8D, an FEC delivery block 840 includes M FEC #1 delivery blocks configured for a first FEC and parity #2 blocks generated through a second FEC. Each FEC #1 delivery block includes a sub-block including a plurality of source payloads and a parity #1 block generated through the first FEC. Each parity block includes a corresponding length parity block.

Up to now, examples arranging the length parity block in a first part of the total parity blocks to configure the FEC delivery block have been described. In a modified exemplary embodiment of the present invention, the length parity block may be transmitted through a header for the parity block or a header for the source block, and in this case, the FEC delivery block includes only the source block and the parity block.

In an exemplary embodiment of the present invention described below, a flag indicating an AL-FEC encoding scheme applied to transmission is used for selecting and applying one of the IBG mode of FIG. 2 and the IBG mode of FIG. 3. For example, the FEC encoder performs an AL-FEC encoding according to the IBG mode of FIG. 2 when the flag is "0", and applies the IBG mode of FIG. 3 to perform the AL-FEC encoding when the flag is "1". The flag may be transmitted to the receiver from the transmitter together with the FEC delivery block or through separate signaling.

Figure 9:
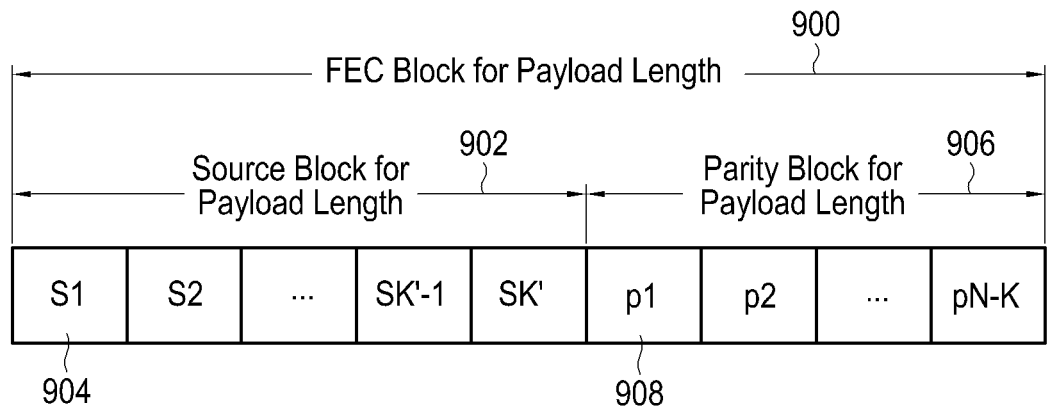
FIG. 9 illustrates an FEC block for payload length according to an exemplary embodiment of the present invention.

FIG. 9 illustrates an FEC block for payload length according to an exemplary embodiment of the present invention.

Referring to FIG. 9, an FEC block for payload length 900 includes a source block 902 including lengths 904 for K' source payloads and a parity block 906 (that is, length parity block) including N−K length parity data 908. When an information block is configured as shown in FIG. 2, the transmitter generates a length parity block 906 from a source block for payload length 902 through the FEC encoding, and transmits the parity block for payload length 906 together with the source block and the corresponding parity block in order to inform the receiver of a length of each source payload. In order to minimize system burden, an equal FEC code to an FEC code used for encoding the source block may be used for generating the length parity block.

When a Packet Error Rate (PER) or a Bit Error Rate (BER) to be achieved after the AL-FEC decoding is determined in the given packet loss channel environment, the IBG mode of FIG. 2 generates P' parity payloads for K' source payloads for the source block, and the IBG mode of FIG. 3 generates P parity payloads for the information block including K information payloads. Comparing the IBG modes of FIGS. 2 and 3, the IBG mode of FIG. 2 further requires (P'−P) parity payloads, and the IBG mode of FIG. 3 further requires the parity data for payload length.

The transmitter predicts P' and P corresponding to numbers of parity payloads according to the two IBG modes, counts the parity data for payload length, sets the flag to "1" and applies the AL-FEC encoding by the IBG mode of FIG. 3 when an amount of the parity data for payload length is smaller than the P'−P parity payloads, and sets the flag to "0" and applies the AL-FEC encoding by the IBG mode of FIG. 2 when the amount of the parity data for payload length is not smaller than the P'−P parity payloads.

When P'=P+p, the amount of the parity data required for the IBG mode of FIG. 2 is counted by $(S_{max}+L) \times (P+p)$, and the amount of the parity data required for the IBG mode of FIG. 3 is counted by $(S_{max}+L \times (1+r)) \times P$. Accordingly, a difference between the parity data is counted by $(S_{max}+L) \times p - L \times r \times P$. Here, L refers to bytes required for expressing the length of each source payload, and r refers to a number of times the length source block is divided. That is, length fields may be divided into one or more sub-blocks for a more robust encoding and individually encoded. When r=1, it means that the length fields are divided into two sub-blocks.

When r=1, a difference between the parity data is $(S_{max}+L) \times p - L \times P$. Here, p denotes the number of parity payloads reduced due to the application of the IBG mode of FIG. 3, and is smaller than $PR \times (K'-K)$. PR denotes a parity rate, and is expressed by a ratio of the parity length to the information length. When $PR = P'/K' = P/K$, $p = P'-P = PR \times (K'-K)$. Since the capability is improved as the information length is longer in the same PR, p should be smaller than $PR \times (K'-K)$ for the same capability. That is, Equation (1) below should be satisfied.

$$(S_{max}+L) \times p - L \times P < (S_{max}+L) \times PR \times (K'-K) - L \times P \quad (1)$$

Since $P = P' - p = PR \times K' - p$, $L \times P = L \times (P'-p) = L \times PR \times K' - L \times p$. Accordingly, Equation (1) may be expressed again as defined in Equation (2).

$$(S_{max}+L) \times p - L \times P < (S_{max}+2 \times L) \times p - L \times PR \times K' < (S_{max}+2 \times L) \times PR \times (K'-K) - L \times PR \times K' = PR \times ((S_{max}+2 \times L) \times (K'-K) - L \times K) \quad (2)$$

In general, since $S_{max}$ and L are fixed during transmission, it is more preferable to apply the IBG mode of FIG. 3 as the parity rate is higher and K−K' is larger, e.g., the amount of the padding data according to the IBG mode of FIG. 2 is larger.

Table 1 to Table 3 below show comparison of total parity amounts according to amounts of the parity rate and the padding rate in a case where K'=100, 200, and 400 when $S_{max}$=1000 bytes, L=2 bytes, and r=1.

Table 1 below shows total parity amounts required for the IBG mode of FIG. 3 and the IBG mode of FIG. 2 when K'=100.

TABLE 1

|  | 5% | 10% | 15% | 20% |
|---|---|---|---|---|
| 95% | 1004 × 5/ 1002 × 5 | 1004 × 10/ 1002 × 10 | 1004 × 15/ 1002 × 15 | 1004 × 19/ 1002 × 20 |
| 90% | 1004 × 5/ 1002 × 5 | 1004 × 9/ 1002 × 10 | 1004 × 14/ 1002 × 15 | 1004 × 18/ 1002 × 20 |
| 85% | 1004 × 5/ 1002 × 5 | 1004 × 9/ 1002 × 10 | 1004 × 13/ 1002 × 15 | 1004 × 17/ 1002 × 20 |
| 80% | 1004 × 4/ 1002 × 5 | 1004 × 8/ 1002 × 10 | 1004 × 12/ 1002 × 15 | 1004 × 16/ 1002 × 20 |

Table 2 below shows total parity amounts required for the IBG mode of FIG. 3 and the IBG mode of FIG. 2 when K'=200.

TABLE 2

|  | 5% | 10% | 15% | 20% |
|---|---|---|---|---|
| 95% | 1004 × 10/ 1002 × 10 | 1004 × 19/ 1002 × 20 | 1004 × 29/ 1002 × 30 | 1004 × 38/ 1002 × 40 |
| 90% | 1004 × 9/ 1002 × 10 | 1004 × 18/ 1002 × 20 | 1004 × 27/ 1002 × 30 | 1004 × 36/ 1002 × 40 |
| 85% | 1004 × 9/ 1002 × 10 | 1004 × 17/ 1002 × 20 | 1004 × 26/ 1002 × 30 | 1004 × 34/ 1002 × 40 |
| 80% | 1004 × 8/ 1002 × 10 | 1004 × 16/ 1002 × 20 | 1004 × 24/ 1002 × 30 | 1004 × 32/ 1002 × 40 |

Table 3 below shows total parity amounts required for the IBG mode of FIG. 3 and the IBG mode of FIG. 2 when K'=400.

TABLE 3

|  | 5% | 10% | 15% | 20% |
|---|---|---|---|---|
| 95% | 1004 × 19/ 1002 × 20 | 1004 × 38/ 1002 × 40 | 1004 × 57/ 1002 × 60 | 1004 × 76/ 1002 × 80 |
| 90% | 1004 × 18/ 1002 × 20 | 1004 × 36/ 1002 × 40 | 1004 × 54/ 1002 × 60 | 1004 × 72/ 1002 × 80 |
| 85% | 1004 × 17/ 1002 × 20 | 1004 × 34/ 1002 × 40 | 1004 × 51/ 1002 × 60 | 1004 × 68/ 1002 × 80 |
| 80% | 1004 × 16/ 1002 × 20 | 1004 × 32/ 1002 × 40 | 1004 × 48/ 1002 × 60 | 1004 × 64/ 1002 × 80 |

In Table 1 to Table 3, a horizontal axis means a parity rate and a horizontal axis means $(S_{max} \times K)/(S_{max} \times K')$, e.g., a rate of padding data when the IBG mode of FIG. 2 is applied. A of A/B within each cell within Table 1 to Table 3 refers to a parity data amount minimally required for the IBG mode of FIG. 3, and B refers to a parity data amount required for the IBG mode of FIG. 2.

When the difference between the parity data amounts required for the IBG mode of FIG. 3 and the IBG mode of FIG. 2 is smaller than 0.5% (difference between data amounts/($S_{max} \times K'$)), it is indicated in bold. The above values are calculated based on FEC delivery, and may vary depending on amounts of a header of each payload, an application protocol header, a transport protocol header, and an Internet protocol header. Since the number of payloads by the IBG mode of FIG. 3 is equal to or smaller than that of the IBG mode of FIG. 2, it is possible to increase effects by the IBG mode of FIG. 3 by taking the headers into account.

Accordingly, as a detailed exemplary embodiment of the present invention, the transmitter can select the IBG mode based on (K'−K) and PR. For example, when a right formula of Equation (1) has a negative value because the parity rate is very small, it is determined to apply the IBG mode of FIG. 2.

In an exemplary embodiment of the present invention described below, a flag indicating an AL-FEC encoding scheme applied to transmission is used and offset information illustrated in FIG. 4 is transmitted to discriminate source payloads on the two-dimensional array in selecting one of the IBG mode of FIG. 2 and IBG mode of FIGS. 3 and 4 and applying the selected IBG mode to the AL-FEC encoding. For example, the FEC encoder applies the IBG mode of FIG. 2 to perform the AL-FEC encoding when the flag is "0", and applies the IBG mode of FIGS. 3 and 4 to perform the AL-FEC encoding when the flag is "1". The flag may be transmitted to the receiver from the transmitter together with the FEC delivery block or through separate signaling.

When a PER or a BER to be achieved after the AL-FEC decoding is determined in the given packet loss channel environment, the IBG mode of FIG. 2 generates P' parity payloads for K' source payloads for the source block, and the IBG mode of FIGS. 3 and 4 generates P parity payloads for the information block including K information payloads. Comparing the IBG modes of FIG. 2 and FIGS. 3 and 4, the IBG mode of FIG. 2 further requires P'−P parity payloads, and the IBG mode of FIGS. 3 and 4 further requires the offset information.

The transmitter predicts P' and P corresponding to numbers of parity payloads according to the two IBG modes, counts an amount of the offset information, sets the flag to "1" and applies the AL-FEC encoding by the IBG mode of FIGS. 3 and 4 when the amount of the offset information is smaller than the P'−P parity payloads, and sets the flag to "0" and applies the AL-FEC encoding by the IBG mode of FIG. 2 when the amount of the offset information is not smaller than the P'−P parity payloads.

When P'=P+p, the amount of the parity data required for the IBG mode of FIG. 2 is calculated as $(S_{max}+L) \times (P+p)$, and the amount of the parity data additionally required for the IBG mode of FIGS. 3 and 4 is $S_{max} \times P + K' \times \text{Off\_lng} = (S_{max} \times L) \times p + L \times P - K' \times \text{Off\_lng}$. Here, Off_lng is an information amount required for the offset information.

Here, p is the number of parity payloads reduced due to the application of the IBG mode of FIG. 3, and is substantially smaller than $PR \times (K'-K)$. The parity rate of PR is indicated by (parity length)/(information length). When PR=P'/K'=P/K, $p=P'-P=PR \times (K'-K)$. Since the capability is improved as the information length is longer in the same PR, p should be smaller than $PR \times (K'-K)$ for the same capability. That is, Equation (3) below is satisfied.

$$(S_{max}+L) \times p + L \times P - K' \times \text{Off\_lng} < (S_{max}+L) \times PR \times (K'-K) + L \times P - K' \times \text{Off\_lng} \qquad (3)$$

Since $P=P'-p=PR \times K'-p$, $L \times P = L \times (P'-p)$ and $(S_{max}+L) \times p + L \times P = (S_{max}+L) \times p + L \times P' - L \times p = S_{max} \times p + L \times P'$. Accordingly, Equation (3) above may be expressed as defined in Equation (4) below.

$$(S_{max}+L) \times p + L \times P - K' \times \text{Off\_lng} < S_{max} \times PR \times (K-K) + L \times P - K' \times \text{Off\_lng} \qquad (4)$$

In general, since $S_{max}$ and L are fixed during transmission, the IBG mode of FIGS. 3 and 4 is more efficient as the parity rate is higher and (K'−K) is larger, e.g., the amount of padding data is larger. Further, since K' is larger as $S_{max}$ is smaller, the IBG mode of FIGS. 3 and 4 is more efficient as $S_{max}$ has a larger value.

Table 4 to Table 6 below show comparison of parity data according to a ratio of the parity rate to the padding rate and total data amounts of additional information in a case where K'=100, 200, and 400 when $S_{max}$=1000 bytes, L=2 bytes, and Off_lng=4 bytes.

Table 4 below shows total data amounts required for the IBG mode of FIGS. 3 and 4 and the IBG mode of FIG. 2 when K'=100.

TABLE 4

|  | 5% | 10% | 15% | 20% |
|---|---|---|---|---|
| 95% | 4 × 100 + 1000 × 5/ 1002 × 5 | 4 × 100 + 1000 × 10/ 1002 × 10 | 4 × 100 + 1000 × 15/ 1002 × 15 | 4 × 100 + 1000 × 19/ 1002 × 20 |
| 90% | 4 × 100 + 1000 × 5/ 1002 × 5 | 4 × 100 + 1000 × 9/ 1002 × 10 | 4 × 100 + 1000 × 14/ 1002 × 15 | 4 × 100 + 1000 × 18/ 1002 × 20 |
| 85% | 4 × 100 + 1000 × 5/ 1002 × 5 | 4 × 100 + 1000 × 9/ 1002 × 10 | 4 × 100 + 1000 × 13/ 1002 × 15 | 4 × 100 + 1000 × 17/ 1002 × 20 |
| 80% | 4 × 100 + 1000 × 4/ 1002 × 5 | 4 × 100 + 1000 × 8/ 1002 × 10 | 4 × 100 + 1000 × 12/ 1002 × 15 | 4 × 100 + 1000 × 16/ 1002 × 20 |

Table 5 below shows total data amounts required for the IBG mode of FIGS. 3 and 4 and the IBG mode of FIG. 2 when K'=200.

TABLE 5

|  | 5% | 10% | 15% | 20% |
|---|---|---|---|---|
| 95% | 4 × 200 + 1000 × 10/ 1002 × 10 | 4 × 200 + 1000 × 19/ 1002 × 20 | 4 × 200 + 1000 × 29/ 1002 × 30 | 4 × 200 + 1000 × 38/ 1002 × 40 |

TABLE 5-continued

|     | 5% | 10% | 15% | 20% |
|-----|----|----|----|----|
| 90% | 4 × 200 + 1000 × 9/ 1002 × 10 | 4 × 200 + 1000 × 18/ 1002 × 20 | 4 × 200 + 1000 × 27/ 1002 × 30 | 4 × 200 + 1000 × 36/ 1002 × 40 |
| 85% | 4 × 200 + 1000 × 9/ 1002 × 10 | 4 × 200 + 1000 × 17/ 1002 × 20 | 4 × 200 + 1000 × 26/ 1002 × 30 | 4 × 200 + 1000 × 34/ 1002 × 40 |
| 80% | 4 × 200 + 1000 × 8/ 1002 × 10 | 4 × 200 + 1000 × 16/ 1002 × 20 | 4 × 200 + 1000 × 24/ 1002 × 30 | 4 × 200 + 1000 × 32/ 1002 × 40 |

Table 6 below shows total data amounts required for the IBG mode of FIGS. 3 and 4 and the IBG mode of FIG. 2 when K'=400.

TABLE 6

|     | 5% | 10% | 15% | 20% |
|-----|----|----|----|----|
| 95% | 4 × 400 + 1000 × 19/ 1002 × 20 | 4 × 400 + 1000 × 38/ 1002 × 40 | 4 × 400 + 1000 × 57/ 1002 × 60 | 4 × 400 + 1000 × 76/ 1002 × 80 |
| 90% | 4 × 400 + 1000 × 18/ 1002 × 20 | 4 × 400 + 1000 × 36/ 1002 × 40 | 4 × 400 + 1000 × 54/ 1002 × 60 | 4 × 400 + 1000 × 72/ 1002 × 80 |
| 85% | 4 × 400 + 1000 × 17/ 1002 × 20 | 4 × 400 + 1000 × 34/ 1002 × 40 | 4 × 400 + 1000 × 51/ 1002 × 60 | 4 × 400 + 1000 × 68/ 1002 × 80 |
| 80% | 4 × 400 + 1000 × 16/ 1002 × 20 | 4 × 400 + 1000 × 32/ 1002 × 40 | 4 × 400 + 1000 × 48/ 1002 × 60 | 4 × 400 + 1000 × 64/ 1002 × 80 |

Table 7 to Table 9 below show comparison of parity data according to a ratio of the parity rate to the padding rate and total data amounts of additional information in a case where K'=100, 200, and 400 when $S_{max}$=500 bytes, L=2 bytes, and Off_lng=4 bytes.

Table 7 below shows total data amounts required for the IBG mode of FIGS. 3 and 4 and the IBG mode of FIG. 2 when K'=100.

TABLE 7

|     | 5% | 10% | 15% | 20% |
|-----|----|----|----|----|
| 95% | 4 × 100 + 500 × 5/ 502 × 5 | 4 × 100 + 500 × 10/ 502 × 10 | 4 × 100 + 500 × 15/ 502 × 15 | 4 × 100 + 500 × 19/ 502 × 20 |
| 90% | 4 × 100 + 500 × 5/ 502 × 5 | 4 × 100 + 500 × 9/ 502 × 10 | 4 × 100 + 500 × 14/ 502 × 15 | 4 × 100 + 500 × 18/ 502 × 20 |
| 85% | 4 × 100 + 500 × 5/ 502 × 5 | 4 × 100 + 500 × 9/ 502 × 10 | 4 × 100 + 500 × 13/ 502 × 15 | 4 × 100 + 500 × 17/ 502 × 20 |
| 80% | 4 × 100 + 500 × 4/ 502 × 5 | 4 × 100 + 500 × 8/ 502 × 10 | 4 × 100 + 500 × 12/ 502 × 15 | 4 × 100 + 500 × 16/ 502 × 20 |

Table 8 below shows total data amounts required for the IBG mode of FIGS. 3 and 4 and the IBG mode of FIG. 2 when K'=200.

TABLE 8

|     | 5% | 10% | 15% | 20% |
|-----|----|----|----|----|
| 95% | 4 × 200 + 500 × 10/ 502 × 10 | 4 × 200 + 500 × 19/ 502 × 20 | 4 × 200 + 500 × 29/ 502 × 30 | 4 × 200 + 500 × 38/ 502 × 40 |
| 90% | 4 × 200 + 500 × 9/ 502 × 10 | 4 × 200 + 500 × 18/ 502 × 20 | 4 × 200 + 500 × 27/ 502 × 30 | 4 × 200 + 500 × 36/ 502 × 40 |
| 85% | 4 × 200 + 500 × 9/ 502 × 10 | 4 × 200 + 500 × 17/ 502 × 20 | 4 × 200 + 500 × 36/ 502 × 30 | 4 × 200 + 500 × 34/ 502 × 40 |
| 80% | 4 × 200 + 500 × 8/ 502 × 10 | 4 × 200 + 500 × 16/ 502 × 20 | 4 × 200 + 500 × 24/ 502 × 30 | 4 × 200 + 500 × 32/ 502 × 40 |

Table 9 below shows total data amounts required for the IBG mode of FIGS. 3 and 4 and the IBG mode of FIG. 2 when K'=400.

TABLE 9

|  | 5% | 10% | 15% | 20% |
|---|---|---|---|---|
| 95% | 4 × 400 + 500 × 19/ 502 × 20 | 4 × 400 + 500 × 38/ 502 × 40 | 4 × 400 + 500 × 57/ 502 × 60 | 4 × 400 + 500 × 76/ 502 × 80 |
| 90% | 4 × 400 + 500 × 18/ 502 × 20 | 4 × 400 + 500 × 36/ 502 × 40 | 4 × 400 + 500 × 54/ 502 × 60 | 4 × 400 + 500 × 72/ 502 × 80 |
| 85% | 4 × 400 + 500 × 17/ 502 × 20 | 4 × 400 + 500 × 34/ 502 × 40 | 4 × 400 + 500 × 51/ 502 × 60 | 4 × 400 + 500 × 68/ 502 × 80 |
| 80% | 4 × 400 + 500 × 16/ 502 × 20 | 4 × 400 + 500 × 32/ 502 × 40 | 4 × 400 + 500 × 48/ 502 × 60 | 4 × 400 + 500 × 64/ 502 × 80 |

In Table 4 to Table 9, a horizontal axis means the parity rate, and a vertical axis means $(S_{max} \times K)/(S_{max} \times K')$, e.g., a rate of the padding data when the IBG mode of FIG. 2 is applied. A of A/B within each cell within Table 4 to Table 9 refers to a data amount minimally required for the configuration of FIGS. 3 and 4, and B refers to a data amount required for the IBG mode of FIG. 2.

When a difference between the data amounts required for the IBG mode of FIGS. 3 and 4 and the IBG mode of FIG. 2 is smaller than 0.5% (difference between data amounts/ $(S_{max} \times K')$), it is indicated in bold. The above values are calculated based on FEC delivery, and may vary depending on amounts of a header of each payload, an application protocol header, a transport protocol header, and an Internet protocol header. Since the number of payloads by the IBG mode of FIGS. 3 and 4 is equal to or smaller than that of the IBG mode of FIG. 2, it is possible to increase effects by the IBG mode of FIG. 3 by taking the headers into account.

As shown in Table 1 to Table 3 and Table 4 to Table 6, parity data and an amount of additional information in the exemplary embodiment of the present invention using the length parity block for the IBG mode of FIG. 3 and the embodiment of using the offset information are compared as follows.

Since the source block and the parity block are equally applied to the two exemplary embodiments of the present invention, their comparison will be omitted. The exemplary embodiment of the present invention using the length parity block requires additional data of (1+r)×L×P, and the exemplary embodiment of the present invention using the offset information requires additional data of Off_set×K'. When L=2 bytes and Off_set=4 bytes, the exemplary embodiment of the present invention using the length parity block is more efficient than the exemplary embodiment of the present invention using the offset information if P<K'. Although a packet loss rate of the channel is 10%, a value of K' is highly larger than a value of P, so that the exemplary embodiment of the present invention using the length parity block is more efficient than the exemplary embodiment of the present invention using the offset information in an aspect of overheads.

Table 10 below shows comparison between data amounts required in the exemplary embodiment using the length parity block and the exemplary embodiment of the present invention using the offset information, e.g., numbers of bytes when $S_{max}$=1000 bytes, L=2 bytes, r=1, and K'=200. Here, since amounts of the source block and the parity block are equal in the two exemplary embodiments of the present invention, the amounts are not considered.

TABLE 10

|  | 5% | 10% | 15% | 20% |
|---|---|---|---|---|
| 95% | 4 × 10/4 × 200 | 4 × 19/4 × 200 | 4 × 29/4 × 400 | 4 × 38/4 × 400 |
| 90% | 4 × 9/4 × 200 | 4 × 18/4 × 200 | 4 × 27/4 × 200 | 4 × 36/4 × 200 |
| 85% | 4 × 9/4 × 200 | 4 × 17/4 × 200 | 4 × 26/4 × 200 | 4 × 34/4 × 200 |
| 80% | 4 × 8/4 × 200 | 4 × 16/4 × 200 | 4 × 24/4 × 200 | 4 × 32/4 × 200 |

Hereinafter, a transmission/reception structure according to an exemplary embodiment of the present invention will be described.

Figure 10A:
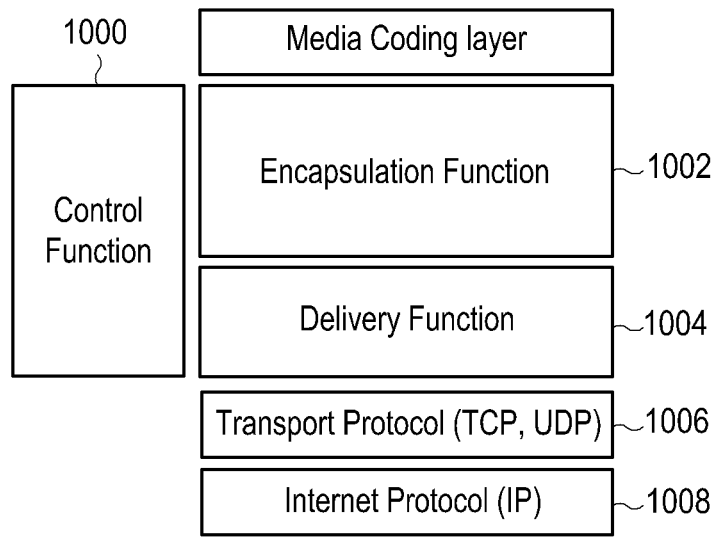
FIGS. 10A and 10B illustrate an Moving Picture Experts Group (MPEG) Media Transport (MMT) system structure and a delivery function layer structure according to an exemplary embodiment of the present invention.
Figure 10B:
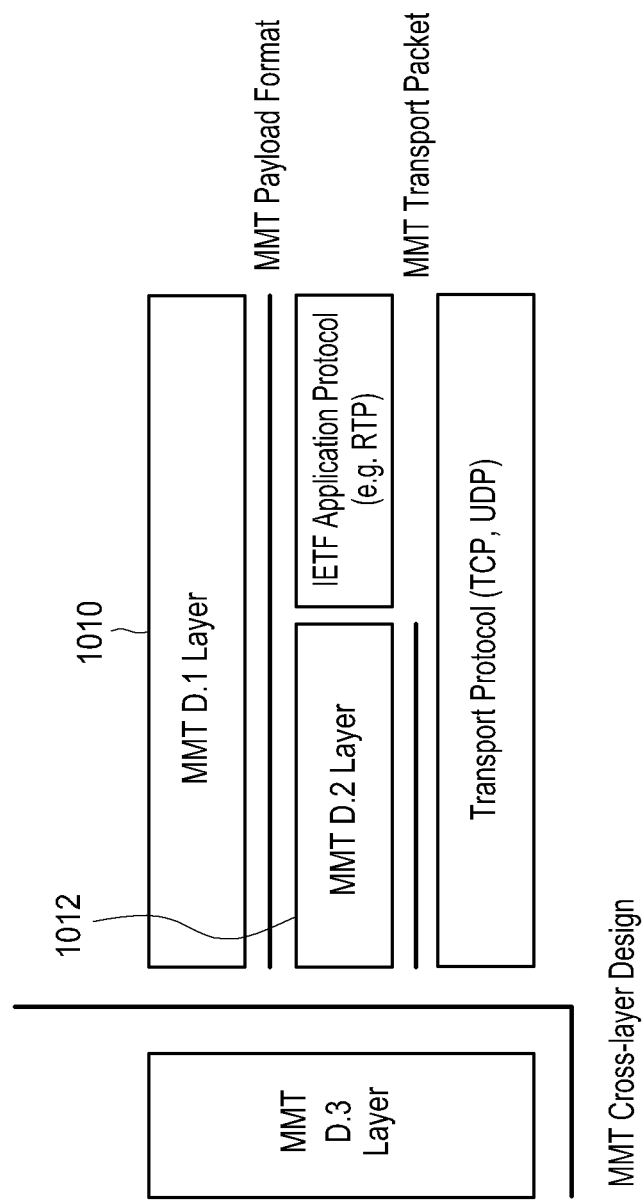

FIGS. 10A and 10B illustrate an MMT system structure and a delivery function layer structure according to an exemplary embodiment of the present invention.

Referring to FIG. 10A, AV data compressed by a media coding layer is packaged in a similar type to a file format via an encapsulation function layer 1002, and then output. A delivery function layer 1004 converts the MMT package output from the encapsulation function layer 1002 to an MMT payload format, configures an MMT transport packet by adding an MMT transport packet header, or configures an RTP packet by using a conventional RTP protocol. Thereafter, the configured packets are finally IP-packetized and transmitted by an IP layer 1008 via the transport protocol layer 1006. A control function unit 1000 which may selectively exist generates control information or signaling information required for data transmission, adds the generated information to the data, and then transmits the information, or transmits the information through a separate signal means.

FIG. 10B illustrates a detailed structure of the delivery function layer 1004. The delivery function layer 1004 includes two layers capable of supporting the encoding by the given FEC code, an MMT D.1 layer 1010, and an MMT D.2 layer 1012. The FEC code may be, for example, a Reed Solomon (RS) code, a Low Density Parity Check (LDPC) code, a Raptor code, a Raptor Q code and the like.

Figure 11:
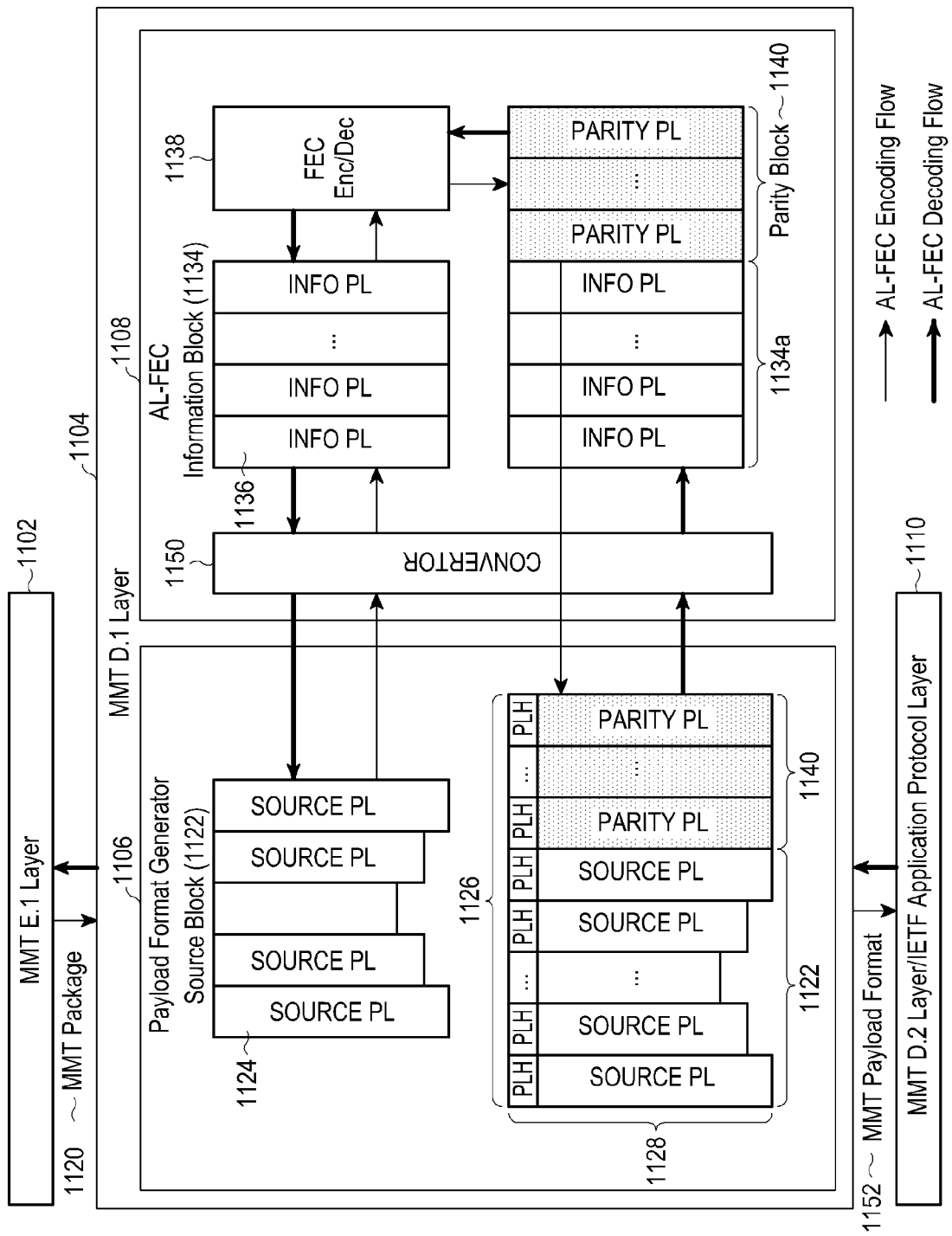
FIG. 11 illustrates an AL-FEC encoding and decoding structure according to an exemplary embodiment of the present invention.

FIG. 11 illustrates a structure of an AL-FEC encoding and decoding according to an exemplary embodiment of the present invention. Although FIG. 11 illustrates a flow in the MMT D.1 layer 1010 supporting the AL-FEC herein, a similar description may be applied to a case where the AL-FEC is supported in the MMT D.2 layer 1012.

Referring to FIG. 11, a payload format generator 1106 of an MMT D.1 layer 1104 receives an MMT package 1120 (for example, a format made for a purpose of storing AV data, a file, a text and the like in a storage unit or transmitting them) from an MMT E.1 layer 1102 serving an encapsulation function, and configures a source block 1122 by dividing the received MMT package 1120 by a predetermined unit for transmission, e.g., into source payloads 1124. The source block is input to an AL-FEC module converter 1150 within an AL-FEC block 1108.

The AL-FEC module converter 1150 converts the source block 1122 to an information block 1134 including information payloads 1136 having the same length according to one of a plurality of predetermined IBG modes, for example, the IBG mode of FIG. 2 or the IBG mode of FIG. 3. An FEC encoder 1138 performs the FEC encoding by the given FEC code to generate a parity block 1140 for the information block 1134, and transmits the parity block 1140 to the payload format generator 1106. The payload format generator 1106 adds the parity block 1140 to the source block 1122, generates an FEC delivery block 1128 by adding a PayLoad Header (PLH) 1126 to each payload, packetizes the FEC delivery block 1128 to an MMT payload format 1152, and then outputs the MMT payload format 1152. The MMT payload format 1152 is transmitted to an MMT D.2 layer 1110 or an Internet Engineering Task Force (IETF) application protocol layer 1110. As a selectable exemplary embodiment of the present invention, a length parity block or length information of source payloads may be added to the parity block 1140 or the payload header 1126. The MMT payload format 1152 is transmitted to the receiver after a UDP header is added in the transport layer and an IP header is added in the Internet layer in the future.

When the MMT payload format 1152 is transmitted to the MMT D.2 layer 1110, the MMT D.2 layer 1110 can configure an MMT transport packet by performing the AL-FEC encoding for the MMT payload, and the MMT transport packet is carried on an IP packet and transmitted to the receiver by the transport layer.

In a decoding, the payload format generator 1106 divides the MMT payload format 1152 received through the MMT D.2 layer/IETF application protocol layer 1110 into the source block 1122 and the parity block 1140, and acquires length information of source payloads included in the source block 1122 through the MMT payload format 1152 or a separate signaling means. An FEC decoder 1138 within the AL-FEC block 1108 decodes an information block 1134a recovered based on the length information and the parity block 1140 to recover lost source payloads. Further, the FEC decoder 1138 decodes the length parity block indicating the length information of the source payloads to acquire lengths of the source payloads. The lengths of the source payloads are used for dividing the information block recovered through the decoding into original source payloads.

Hereinafter, FEC block generation according to an encoding method will be described with reference to FIGS. 12 to 14.

Figure 12:
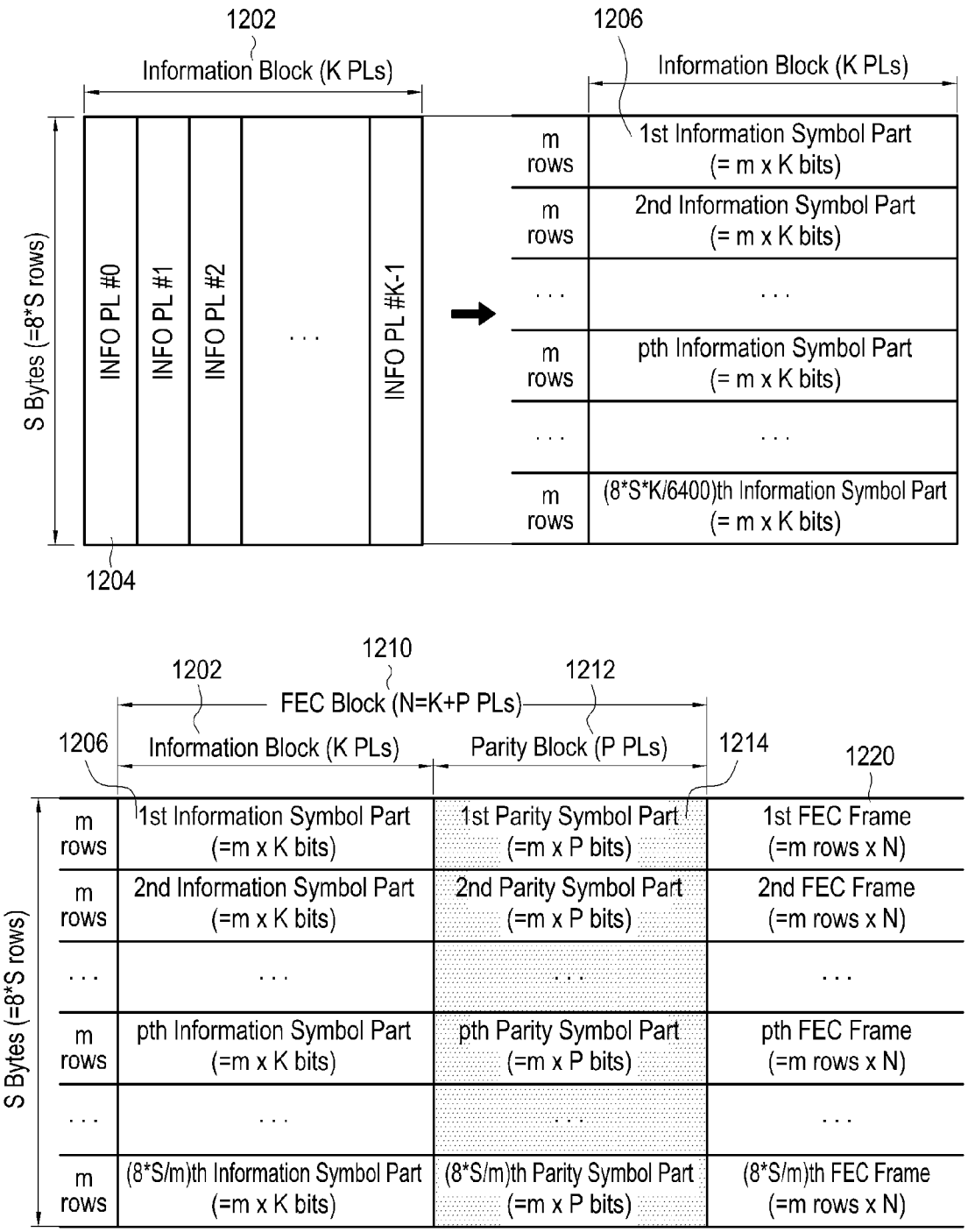
FIG. 12 illustrates a configuration of an FEC block according to an exemplary embodiment of the present invention.

FIG. 12 illustrates a configuration of an FEC block according to an exemplary embodiment of the present invention.

Referring FIG. 12, an information block 1202 including K information payloads (INFO PL) 1204 having a size of S bytes may be divided into S information symbol parts 1206, each of which includes m rows by the unit of rows, and each information symbol part 1206 is configured in m×K bits. A parity block 1212 generated from the information block 1202 is similarly divided into S parity symbol parts 1214. An FEC block 1210 includes the information block 1202 and the parity block 1212. Specifically, the FEC encoder generates the parity symbol part 1214 according to the given FEC code from each information symbol part 1206, and configures an FEC frame 1220 including the information symbol part and the parity symbol part 1214. The FEC block 1210 includes S FEC frames 1220 having a size of m×N bits. Here, m is a divisor of 8×5, and may be, for example, 1 or 8.

Figure 13:
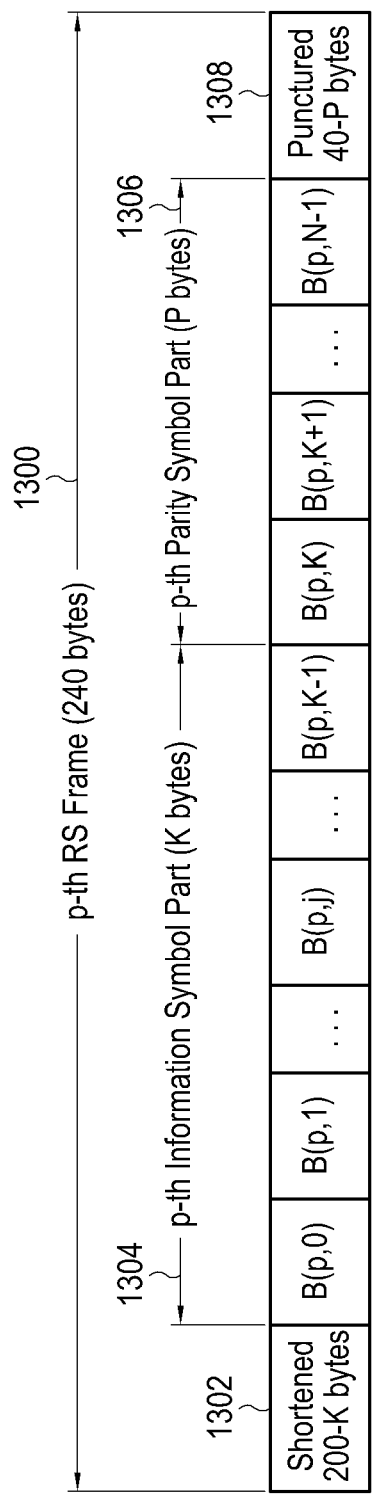
FIG. 13 illustrates a configuration of an FEC frame according to another exemplary embodiment of the present invention.

FIG. 13 illustrates a configuration of a Reed Solomon (RS) frame according to an exemplary embodiment of the present invention. The RS frame refers to an FEC frame when an RS code is used for the AL-FEC, and corresponds herein to the RS frame by RS (240,200) code over GF(2^8) when m=8.

Referring to FIG. 13, a pth byte row of the information block including K payloads becomes a pth information symbol part of K bytes 1304, and the transmitter generates parity bytes 1306 and 1308 of 40 bytes by padding 1302 (200-K) bytes into the information symbol part 1304 with 00h and then performing an encoding. A pth RS frame 1300 includes shortened bytes 1302 corresponding to an encoding input, an information symbol part 1304, and parity bytes 1306 and 1308 corresponding to an encoding output. The transmitter finally transmits only the information symbol part of K bytes 1304 and the parity symbol part of P bytes 1306 by shortening first (200-K) padding bytes 1302 of the RS frame 1300 and puncturing last (40-P) bytes 1308. B(p, j) refers to a jth byte of the pth RS frame.

Figure 14:
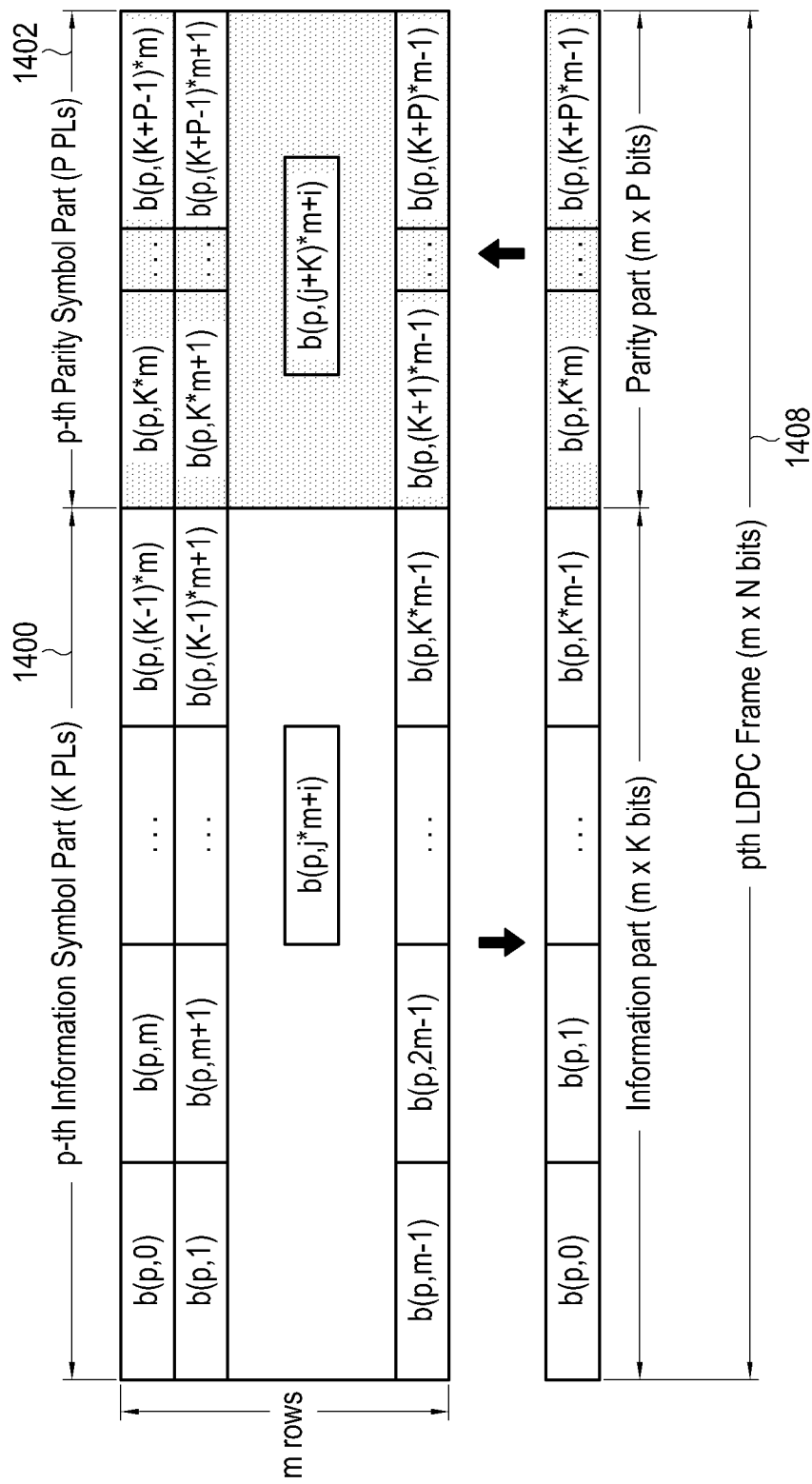
FIG. 14 illustrates a configuration of an FEC frame according to yet another exemplary embodiment of the present invention.

FIG. 14 illustrates a configuration of an LDPC frame according to an exemplary embodiment of the present invention. The LDPC frame refers to an FEC frame when an LDPC code is used for the AL-FEC, and corresponds to herein the LDPC frame by LDPC(m×(K+P), m×K) code over GF(2).

Referring to FIG. 14, a pth m row of an information block including K payloads becomes a pth information symbol part of m×K bits 1400, and the transmitter generates a pth LDPC frame 1408 by connecting a parity symbol part 1402 having m×P parity bits with an information symbol part 1400. Here, m is a positive integer. b(p,j*m+i) refers to an ith bit of an mth row of a jth payload in the pth LDPC frame. When m is larger than 1, b(p, j*m+i) is allocated numbers from a first payload from a top to a bottom (that is, payload preferentially), but the numbers may be allocated from a first row from a left side to a right side (that, row preferentially) in another exemplary embodiment of the present invention.

Hereinafter, generation of the parity block for payload length will be described with reference to FIGS. 15 to 19.

The payload length information of the source block may be configured by receiving the length of each source payload when the payload format generator 1106 configures the source block including source payloads, or provided to the AL-FEC block 1108 from a system controller (not shown). As another exemplary embodiment of the present invention, when the payload length information is transmitted through the payload header 1126, the payload format generator 1106 may transmit the source payloads 1124 and the payload length information together to the AL-FEC module 1108.

The FEC capability for payload length should be better than the FEC capability for the source block as described above. As one exemplary embodiment of the present invention for improving the FEC capability for payload length, the payload length information may be divided into two length source blocks and parity data having N−K columns for each length source block may be generated. (N−K) is equal to the number of parity payloads included in the parity block generated from the source block for source payload. As described above, when the payload length information is divided, while parity data having the same amount may be secured for each length source block, an amount of information is reduced in half, so that a better FEC capability may be exhibited.

Figure 15:
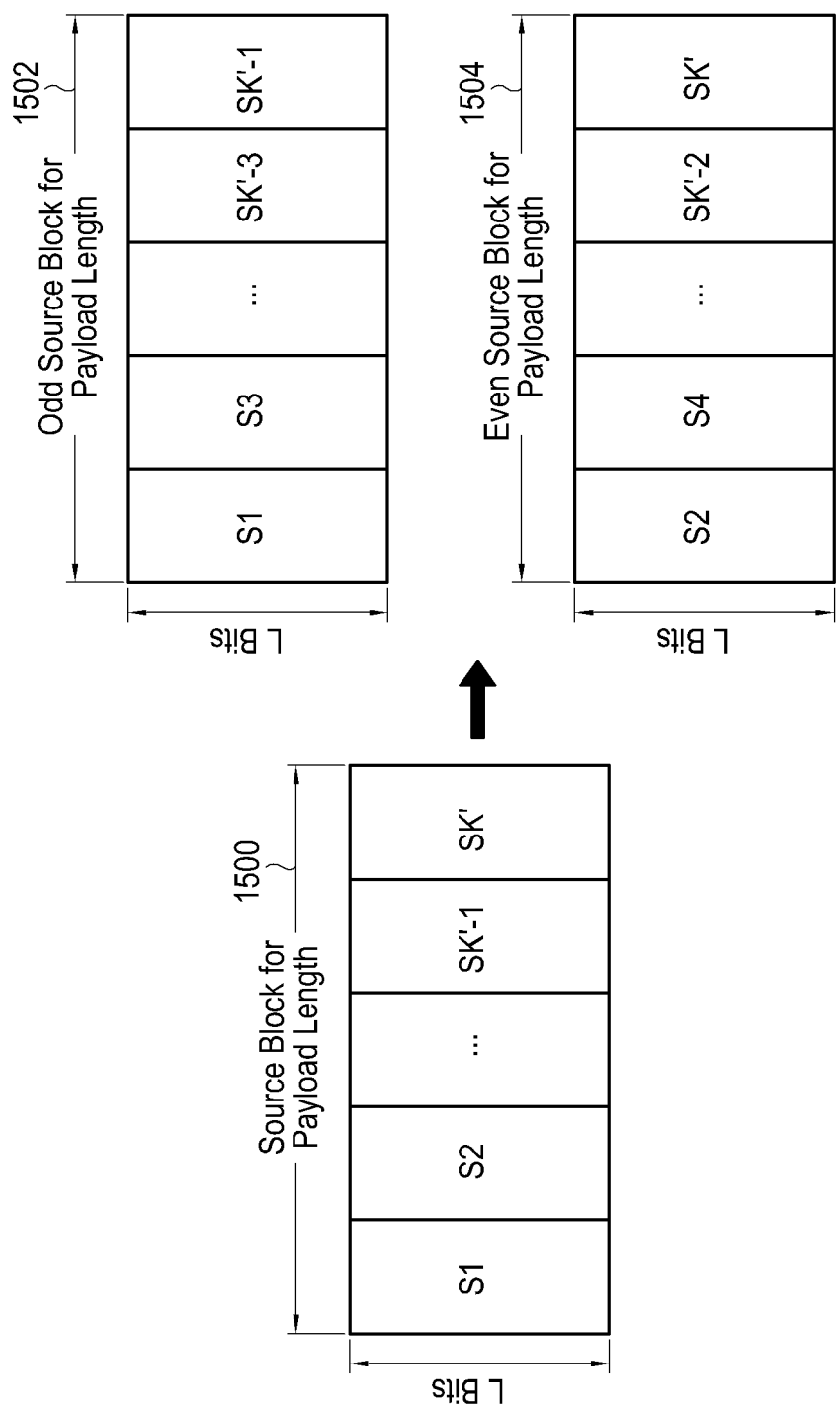
FIG. 15 illustrates division of a source block for payload length according to an exemplary embodiment of the present invention.

FIG. 15 illustrates division of a source block for payload length according to an exemplary embodiment of the present invention.

Referring to FIG. 15, when L bits are allocated to a payload length field for each of the K' source payloads, a source block for payload length 1500 (that is, length source block) includes K' L bits length fields S1, S2, . . . SK'. The source block for payload length 1500 may be divisibly encoded into an odd-numbered source block 1502 including odd-numbered length fields S1, S3, . . . SK'−1 and an even-numbered source block 1504 including even-numbered length fields S2, S4, . . . SK'. When K' is an odd number, the odd-numbered source block

1502 may include S1, S3, ..., SK' and the even-numbered source block 1504 may include S2, S4, ..., SK'−1.

Figure 16:
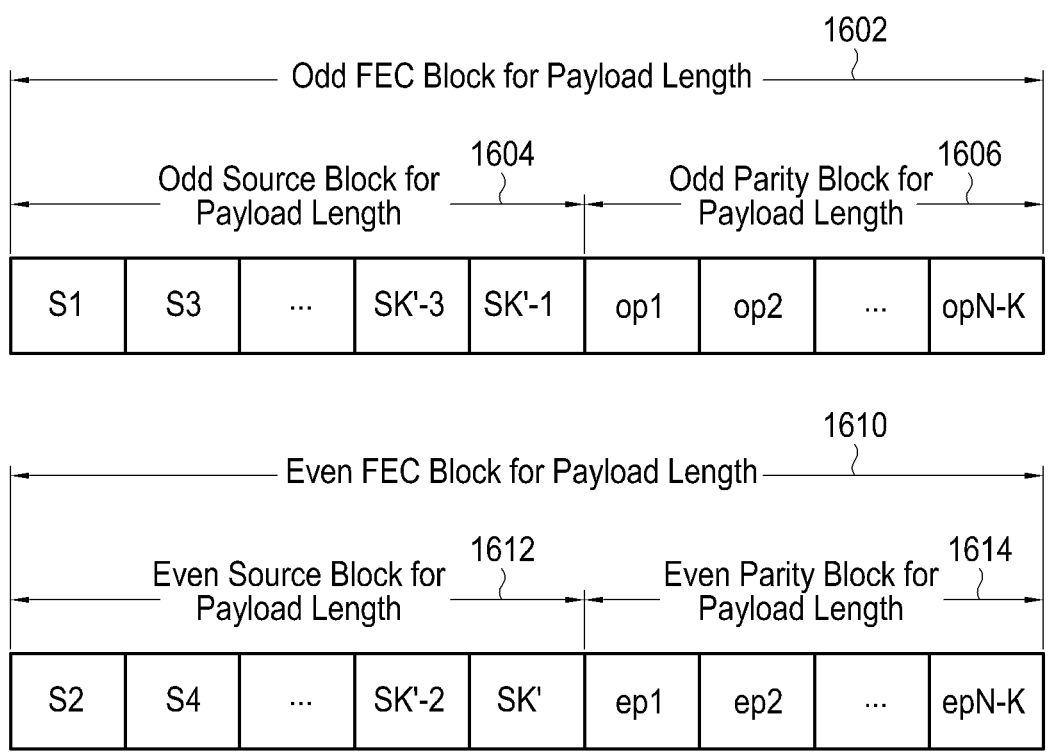
FIG. 16 illustrates a configuration of FEC blocks for divided length source blocks according to an exemplary embodiment of the present invention.

FIG. 16 illustrates a configuration of FEC blocks for divided length source blocks according to an exemplary embodiment of the present invention.

Referring to FIG. 16, odd-numbered/even-numbered parity blocks for payload length 1606 and 1614 are generated from odd-numbered/even-numbered source blocks for payload length 1604 and 1612. Odd-numbered/even-numbered FEC blocks for payload length 1602 and 1610 include the odd-numbered/even-numbered source blocks 1604 and 1612 and the odd-numbered/even-numbered parity blocks 1606 and 1614. The odd-numbered parity block 1606 includes (N−K) odd-numbered parity data op1, op2, ..., opN−K, and the even-numbered parity block 1614 includes (N−K) even-numbered parity data ep1, ep2, ..., epN−K.

As another exemplary embodiment of the present invention, the FEC code for payload length is designed such that a case where the recovery of the payload lengths is not possible while the source block for source payload is recover is hardly generated. For example, when a recovery capability of the source block for source payload requires a packet error rate (PER) of 10^(−7), the recovery capability of the payload lengths may be designed to be equal to or smaller than 10^(−7), for example, 10^(−9).

As another exemplary embodiment of the present invention for the FEC of payload length, a parity block having 2×(N−K) columns for total source blocks for payload length may be generated.

As yet another exemplary embodiment of the present invention, the parity block for payload length may be generated using the same method and the same FEC code as those used when the parity block is generated from the source block for source payload. Since an information size of each length source block is shorter than that of the source block for source payload, the FEC encoder generates parity data by adding padding data to each information symbol of the source block for payload length, and then shortens the padding data among the parity data. In general, since the padding data for the information block generation of FIG. 2 is highly smaller than 50%, K becomes a highly larger number than K'/2. For example, when the padding rate is 10%, K=180 for K'=200, and odd-numbered/even-numbered source blocks for payload length 1502, 1504, 1604, and 1612 are configured in an array having L×100 Columns. Accordingly, it is possible to acquire the better FEC capability.

Figure 17:
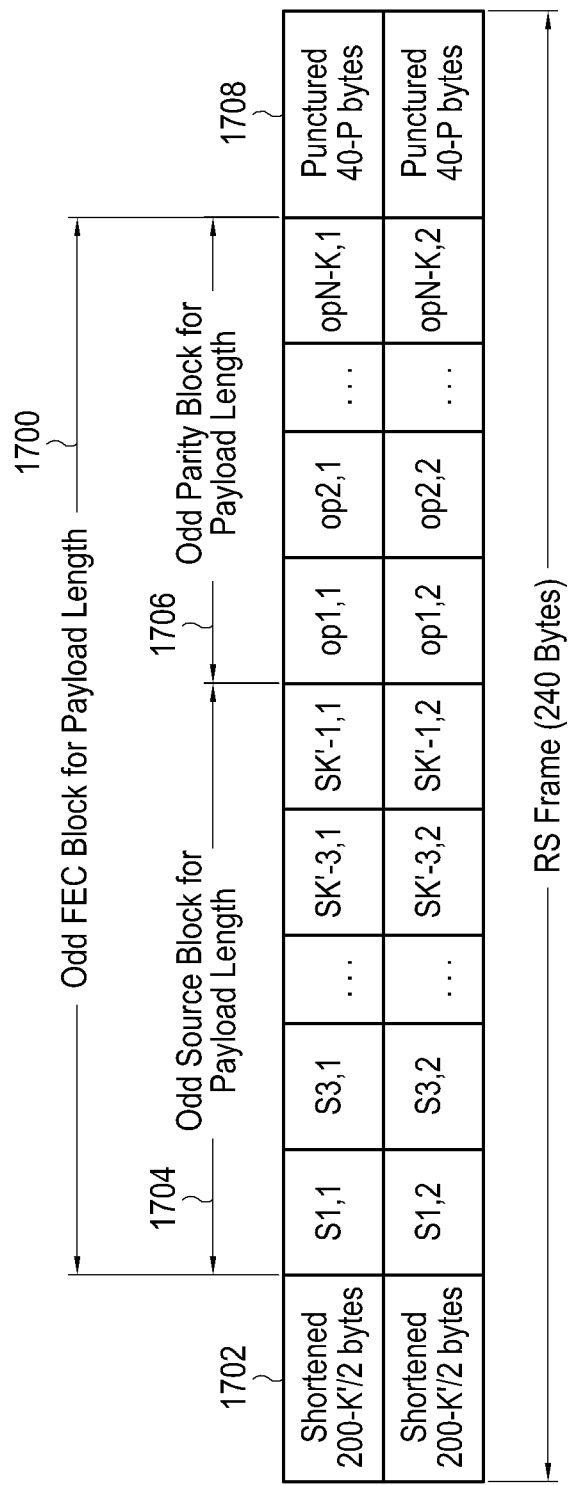
FIG. 17 illustrates a configuration of odd-numbered FEC blocks for payload length according to an exemplary embodiment of the present invention.

FIG. 17 illustrates a configuration of an odd-numbered FEC block for payload length according to an exemplary embodiment of the present invention. Although FIG. 17 illustrates only the configuration of the odd-numbered FEC block, an even-numbered FEC block may be similarly configured.

Referring to FIG. 17, an odd-numbered FEC for payload lengths 1700 includes an odd-numbered source block 1704 and an-odd numbered parity block 1706 generated from the odd-numbered source block 1704. When each payload length is 2 bytes, the odd-numbered source block 1704 has 2 bytes× K'/2 columns. When K'/2 is equal to or smaller than 200, the odd-numbered source block 1704 may be divided into two sub source blocks, each of which includes first bytes and second bytes of each payload length and then encoded by an RS(240,40) code. The FEC encoder pads 1702 200−K'/2 bytes into each sub source block having K'/2 bytes with 00h, and then generates parity data having 40 bytes from the padded block. The FEC encoder shortens 200-K'/2 padding bytes 1702 in the padded block and punctures 40-P bytes 1708 of the parity data to transmit (N−K) bytes.

A first sub source block of the odd-number source block 1704 includes S1,1, S3,1, ... SK'−1,1, and the parity block for the first sub source block includes op1,1, op2,1, ... opN−K,1. A second sub source block includes S1,2, S3,2, ... SK'−3,2, the parity block for the second sub source block includes op1,2, op2,2, ... opN−K,2. Here, Si,j refers to a jth byte of Si, and opi, j refers to a jth byte of ith parity data. For the odd numbered source block 1704, i=1, 3, ..., K' and j is 1 or 2.

As a modified exemplary embodiment of the present invention, when 2×(N−K) is smaller than 40, 2×(N−K) parity bytes may be generated using the first sub source block for payload length and the RS (240,40) code, and then the parity block for payload length may be generated.

Figure 18:
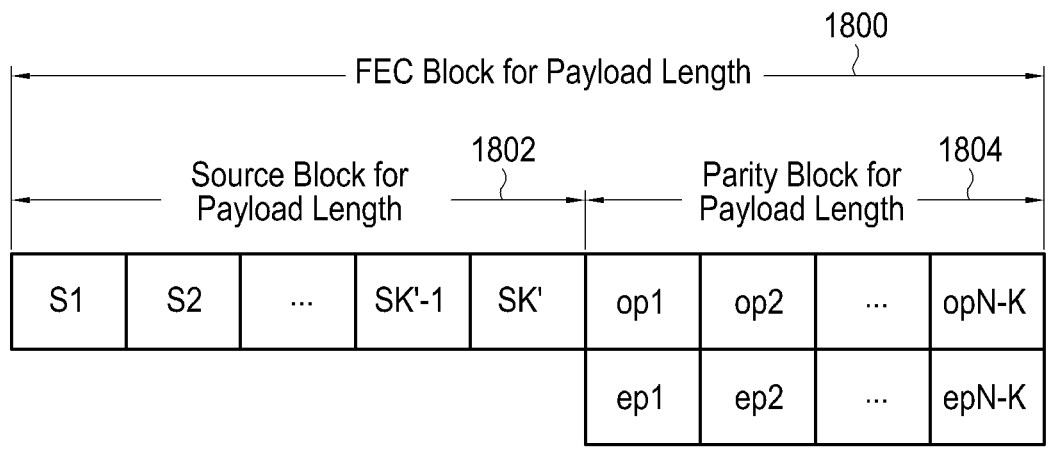
FIG. 18 illustrates a configuration of an FEC block for payload length according to an exemplary embodiment of the present invention.

FIG. 18 illustrates a configuration of an FEC block for payload length according to an exemplary embodiment of the present invention.

Referring to FIG. 18, an FEC block for payload length 1800 includes a source block for payload length 1802 and a parity block for payload length 1804. The parity block for payload length 1804 includes parity data op1, op2, ..., opN−K generated from the odd-numbered source block for payload length and parity data ep1, ep2, ..., epN−K generated from the even-numbered source block.

Figure 19:
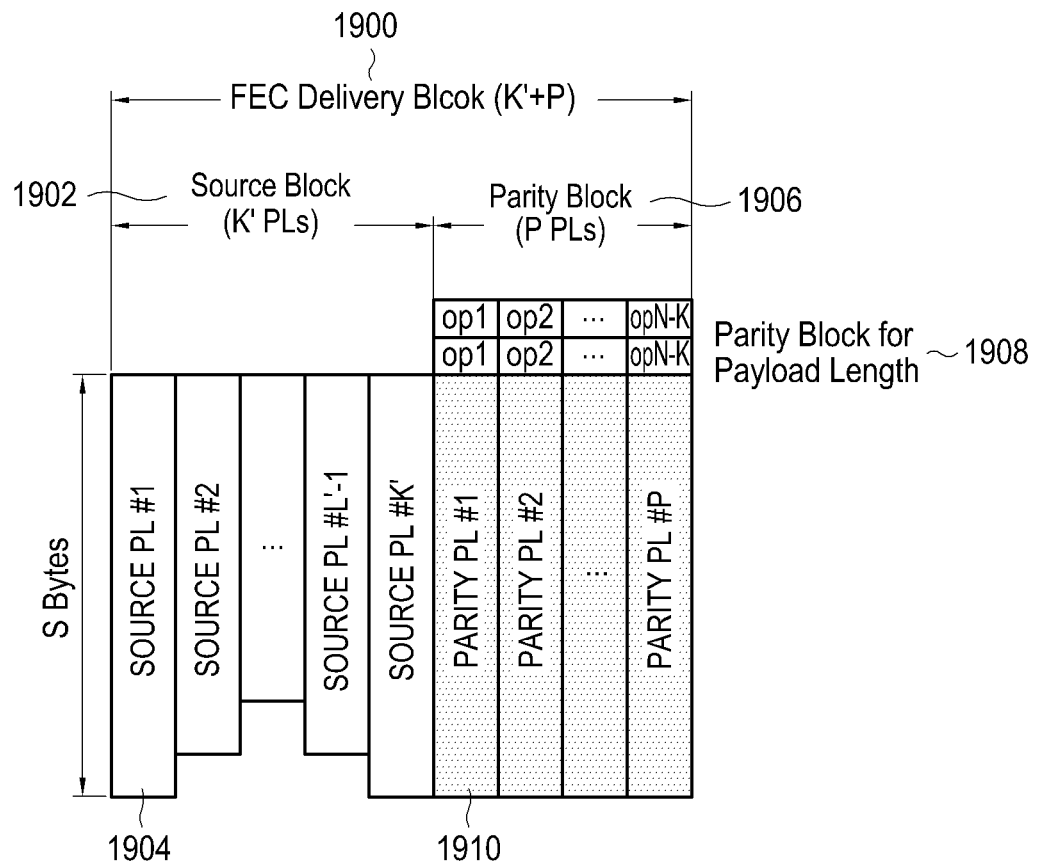
FIG. 19 illustrates a configuration of an FEC delivery block according to an exemplary embodiment of the present invention.

FIG. 19 illustrates a configuration of an FEC delivery block according to an exemplary embodiment of the present invention.

Referring to FIG. 19, an FEC delivery block 1900 includes a source block 1902 including K' source payloads 1904 and a parity block 1906 including P parity payloads 1910, and further includes a parity block for payload length 1908. Here, each column of the parity block for payload length 1908 is arranged in a front part of each payload of the parity block 1906. As another exemplary embodiment of the present invention, the parity block 1908 may be arranged in the front part or a rear part of each source payload of the source block 1902. As yet another exemplary embodiment of the present invention, the parity block 1908 may be arranged in a payload header for the source payloads or in a payload header for the parity payloads 1910. As still another exemplary embodiment of the present invention, the parity block 1908 for the payload may be transmitted through separate control signaling from the FEC delivery block 1900.

As still yet another exemplary embodiment of the present invention, when the source block for the payload is encoded using the LDPC code, the transmitter can configure the FEC block for payload length in the same type as that of FIG. 18 by dividing the source block for the payload into two sub-blocks, adding padding data to each sub-block to encode the sub-blocks, and then shortening the padding data. At this time, it is possible to increase a use efficiency of the FEC encoding and decrease system burden by using the same FEC code as that used when the source block for source payload is encoded. That is, the FEC encoder 510 may be more simply configured to support only one FEC code.

As another exemplary embodiment of the present invention, the FEC encoder generates the parity block for payload length arranged on an array having a size of L×2(N−K) from the source block for payload length arranged on an array having a size of L×K', first (N−K) columns of the L×2(N−K) array, e.g., L×(N−K) columns are generated by using the same FEC code as that of the source block for the source payloads, and the remaining L×(N−K) columns may be generated through a code expanded from the FEC code. When an H matrix having a size of 2(N−K)×(K'+2(N−K)) is assumed, the source block for the source payloads is encoded using a sub matrix (N−K)×N of the H matrix, and the source block for payload length may be encoded directly using the H matrix.

The FEC encoder can reduce system burden by performing two encodings by using one H matrix.

Each payload of the FEC delivery block is carried on the MMT payload format or the MMT transport packet and then transmitted in the MMT system structure.

Figure 20:
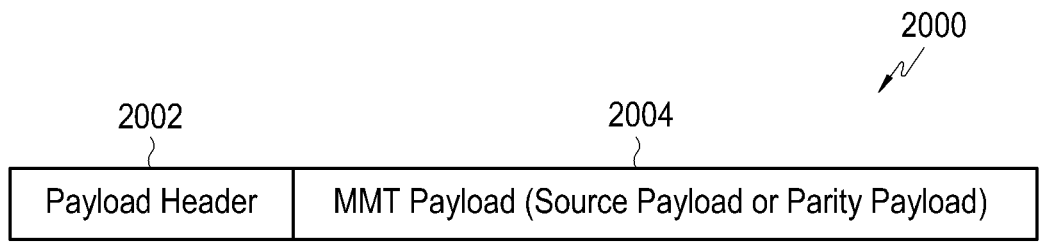
FIG. 20 illustrates an MMT payload format according to an exemplary embodiment of the present invention.

FIG. 20 illustrates an MMT payload format according to an exemplary embodiment of the present invention.

Referring to FIG. 20, an MMT payload format 2000 includes a Payload Header (PLH) 2002 and an MMT payload 2004. The MMT payload 2004 includes one of source payloads and parity payloads of the FEC delivery block generated according to the exemplary embodiment of the present invention. When the parity block for payload length is transmitted through the MMT payload, the payload header 2002 or each parity payload may further include each column of the parity block for payload length.

Information indicating the IBG mode selected according to the exemplary embodiment of the present invention and FEC signals such as parity data for payload length are transmitted together with payloads through, for example, the MMT payload 2004 or the payload header 2002, or may be transmitted through a separate signaling means from the payloads as another exemplary embodiment. The separate signaling means may refer to, for example, the control function unit 1000 in FIG. 10A, the MMT D.3 layer in FIG. 10B, or another control signaling means which is not illustrated. Hereinafter, an exemplary embodiment of the present invention where FEC signals are transmitted through a payload header will be described.

Figure 21:
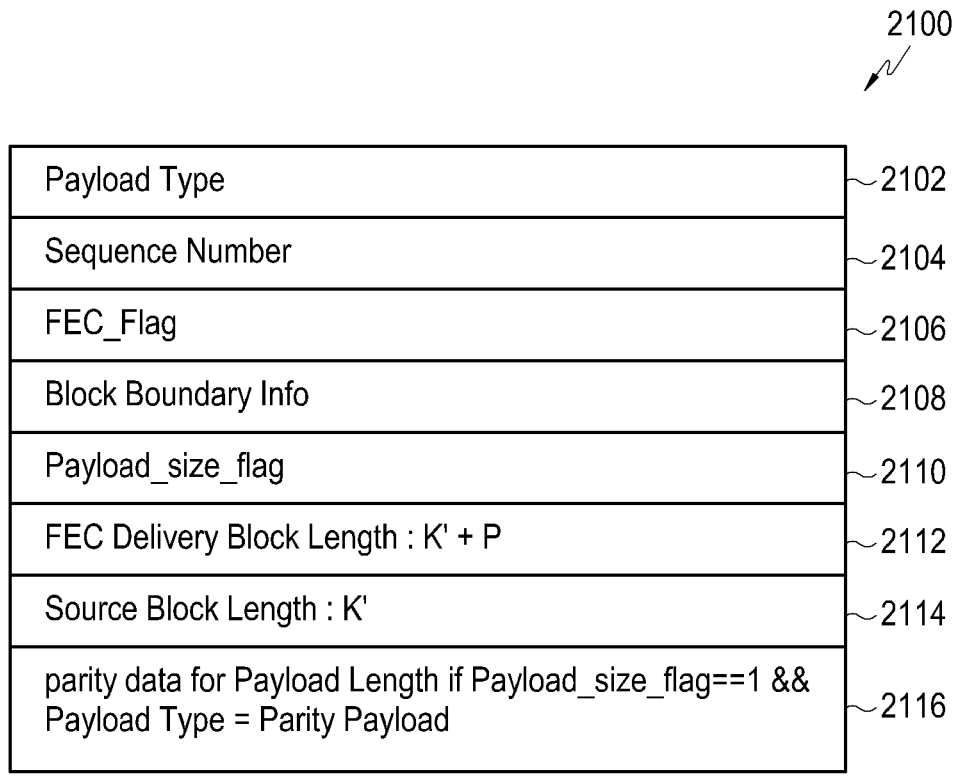
FIG. 21 illustrates a payload header format included in an MMT payload format according to an exemplary embodiment of the present invention.

FIG. 21 illustrates a payload header format included in an MMT payload format according to an exemplary embodiment of the present invention.

Referring to FIG. 21, in a payload header 2100, a payload type 2102 indicates whether a payload of a corresponding MMT payload format is the source payload or the parity payload.

A sequence number 2104 is a value allocated to each payload while sequentially increasing or decreasing to show an order of transmitted payloads, and the receiver can know whether the packet (that is, payload) is lost or not from the sequence number 2104. When the sequence number 2104 is included within a transport protocol header, for example, an MMT packet header or an RTP header and then transmitted, the sequence number 2104 may be omitted within a payload header 2100.

An FEC flag 2106 indicates whether the FEC is applied. For example, an FEC flag "0" means that only the source block is transmitted without the parity payload, and an FEC flag "1" means that the parity block is added to the source block, e.g., the FEC method is applied and then the source block with the added parity block is transmitted.

Block boundary information 2108 shows a boundary of the FEC delivery block. For example, a sequence number of a first source payload of the FEC delivery block may be allocated to the block boundary information 2108 of all headers. The block boundary information 2108 servers as an IDentifier (ID) of the FEC delivery block, and is set to headers of all payloads of the FEC delivery block.

A payload size flag 2110 indicates whether lengths of all source payloads within the source block are consistent or not. For example, a payload size flag "0" indicates that all source payloads within the source block have the same length, and in this case, the source block=the information block, so that it is not required to generate the parity block for payload length. A payload size flag "1" indicates that the parity block for payload length is generated and transmitted because lengths of the source payloads within the source block are not consistent.

An FEC delivery block length 2112 indicates K'+P corresponding to the number of payloads included in the FEC delivery block.

A source block length 2114 indicates K' corresponding to the number of source payloads included in the source block.

When the payload size flag is "1" and the payload type 2102 indicates the parity payload, parity data for payload length 2116 may be further included in the payload header 2100.

The receiver grasps K' corresponding to the number of source payloads and P corresponding to the number of parity payloads within the FEC delivery block boundary and the FEC delivery block from the payload header 2100. When information on the length of each payload is not included in the payload header 2100, the receiver counts the lengths from the received source payloads to generate the source block for payload length, and acquires the parity block for payload length from the front part of the received parity block to recover the FEC block for payload length. Within the recovered FEC block, a length field and parity data corresponding to payloads which are not received are erased.

The receiver recovers the source block for payload length by decoding the recovered FEC block by using a prearranged FEC code and detects lengths of all source payloads from the source block for the recovered payload length to arrange the received source payloads on the two-dimensional S×K array. Further, the FEC block is recovered by arranging the received parity payloads on the corresponding S×P array. Within the recovered FEC block, a space for the payloads which are not received is erased. The receiver performs the decoding for the recovered FEC block by using the prearranged FEC code to recover the information block. When padding data exists in a last payload of the recovered information block, the receiver removes the padding data and then outputs the source block. When data is transmitted by a stream on the system, the information block except for the padding data is the same as the source block. When the data is transmitted by the unit of payloads, the receiver can convert the information block to the source block based on the detected lengths.

Figure 22:
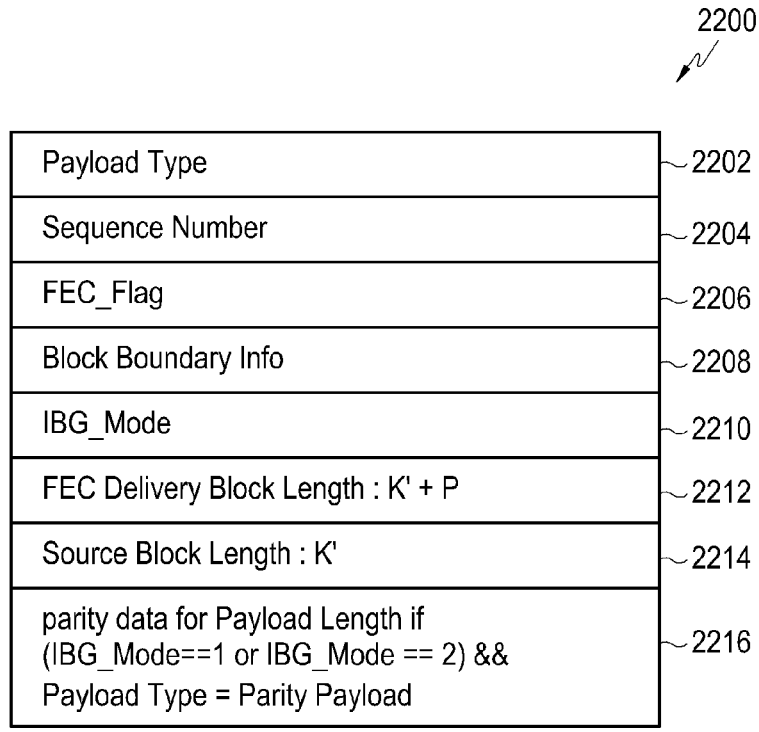
FIG. 22 illustrates a payload header format according to another exemplary embodiment of the present invention.

FIG. 22 illustrates a payload header format according to another exemplary embodiment of the present invention.

Referring to FIG. 22, descriptions of a payload type 2202, a sequence number 2204, an FEC flag 2206, block boundary information 2208, an FEC delivery block length 2212, and a source block length 2214 are the same as those of FIG. 21, and an IBG mode 2210 and parity data for payload length 2216 in a payload header 2200 are described below.

IBG_Mode=0 indicates Source block=information block since lengths of all source payloads are the same, i.e., fixed, and the FEC delivery block is configured and transmitted without generation of the parity data for payload length 2216. IBG_Mode=1 indicates that the information block is generated and AL-FEC encoded according to the information block generation mode of FIG. 2, and IBG_Mode=2 indicates that the information block is generated and AL-FEC encoded by the information block generation mode of FIG. 3. The parity data for payload length 2216 is included in case of that IBG_Mode=1 or 2 and the payload type 2202 indicates the parity payload.

FIG. 22 illustrates a payload header format for a case where the parity block for payload length 1908 is stored within the payload header corresponding to the front part 1906 of the parity block and then transmitted as illustrated in FIG. 19. As described above, the parity data stored in each payload header when IBG_Mode=2 is larger than the parity data stored in each payload header when IBG_Mode=1. It is because it is sufficient that the FEC capability for payload length when IBG_Mode=1 is the same as the FEC capability for the source block, but the FEC capability for payload length when IBG_Mode=2 should be better the FEC capability for the source block For example, when 2 bytes are required for payload length and the parity data for payload length is generated with two times capability in comparison with the case where IBG_Mode=1 for IBG_Mode=2, the parity data for payload length 2216 requires 2 bytes within each payload header for IBG_Mode=1 and the parity data for payload length 2216 requires 4 bytes within each payload header for IBG_Mode=2.

Figure 23:
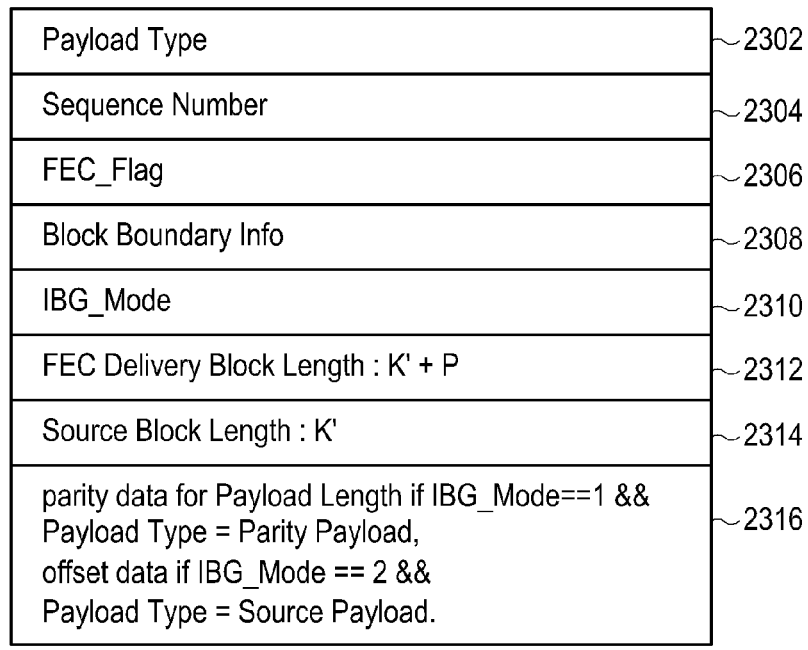
FIG. 23 illustrates a payload header format according to yet another exemplary embodiment of the present invention.

FIG. 23 illustrates a payload header format according to yet another exemplary embodiment of the present invention.

Referring to FIG. 23, descriptions of a payload type 2302, a sequence number 2304, an FEC flag 2306, block boundary information 2308, an FEC delivery block length 2312, and a source block length 2314 in a payload header 2300 are the same as those of FIG. 21, and an IBG_Mode 2310 and a last field 2316 will be described below.

IBG_Mode=0 satisfies Source block=information block since lengths of all source payloads are the same, and accordingly indicates that the FEC delivery block is configured and transmitted without generation of the parity data for payload length 2316. IBG_Mode=1 indicates that the information block is generated and is AL-FEC encoded according to the information block generation mode of FIG. 2, and IBG_Mode=2 indicates that the information block is generated and is AL-FEC encoded by the information block generation mode of FIG. 3. When IBG_Mode=1 and the payload type 2302 indicates the parity payload, the parity data for payload length is included as the last field 2316. When IBG_Mode=2 and the payload type 2302 indicates the source payload, an offset indicating a start position of the corresponding source payload is included as the last field 2316.

In the case where IBG_Mode=2, the receiver can generate the information block of the S×K array from header information such as the FEC delivery block length 2312, the source block length 2314, block boundary information, and an offset.

When a two stage FEC encoding structure is applied, in the payload header, parity data for the sub-block for payload length is included in a parity #1 payload header of which a payload type is generated by a first FEC encoding, and parity data for the source block for payload length is included in a parity #2 payload header of which a payload type is generated by a second FEC encoding.

Figure 24:
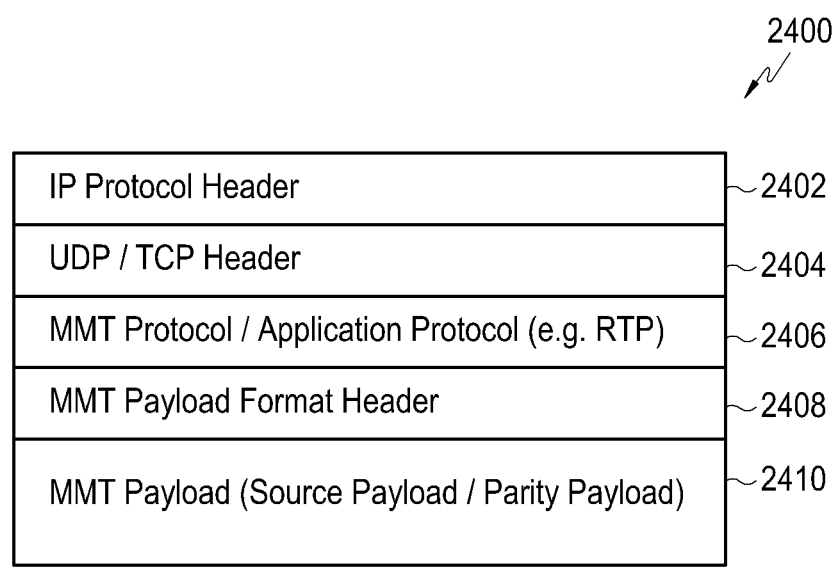
FIG. 24 illustrates a protocol stack of a packet for transmission of an MMT payload according to an exemplary embodiment of the present invention.

FIG. 24 illustrates a protocol stack of a packet for transmission of an MMT payload according to an exemplary embodiment of the present invention.

Referring to FIG. 24, an IP packet 2400 includes an IP protocol header 2402, a UDP/TCP header 2404, an MMT protocol/application protocol header 2406, an MMT payload format header 2408, and an MMT payload 2410. The MMT payload 2410 includes the source payload or the parity payload generated according to one of the exemplary embodiments of the present invention, and the MMT payload format header 2408 includes information related to the payload included in the MMT payload 2410. Particularly, the MMT payload format header 2408 includes the IBG_Mode indicating the mode of the information block configuration, and parity data for payload length as necessary.

While the present invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An encoding method in a data communication system, the method comprising:
   identifying a source block including a plurality of source payloads;
   generating a symbol block including a plurality of symbol payloads from the source block according to a generation mode from among a plurality of generation modes;
   encoding the symbol block according to an encoding scheme to make at least one packet;
   transmitting the at least one packet to a receiver; and
   transmitting, to the receiver, a signaling message including an information field indicating the generation mode,
   wherein each of the plurality of generation modes indicates how the symbol block is configured by using the plurality of source payloads included in the source block, and
   wherein, in at least one of the plurality of generation modes, the source block is split into a plurality of sub-blocks each including at least one of the plurality of source payloads, at least a portion of a sub-block is included in a symbol payload, and a source payload is placed into at least one symbol payload of the symbol block.

2. The method of claim 1, wherein the plurality of generation modes includes at least one of
   a first generation mode for generating the plurality of symbol payloads equally to the plurality of source payloads in case of that the source block consists of the plurality of source payloads with a same size,
   a second generation mode for generating the plurality of symbol payloads by adding padding data to at least one of the plurality of source payloads in order to make the plurality of symbol payloads have an equal size in case of that the source block consists of the plurality of source payloads with variable sizes, and
   a third generation mode for dividing the source block into a plurality of sub-blocks each including at least one of the plurality of source payloads, serializing the corresponding source payloads of each sub-block, configuring each S bytes of the serialized source payloads as one symbol payload, and configuring a last symbol payload of a corresponding sub-block by adding padding data to remaining of the serialized source payloads in case of that the source block consists of the plurality of source payloads with variable sizes.

3. The method of claim 1, further comprising:
   encoding a length source block including length fields of the plurality of source payloads to generate a parity block for payload length; and
   transmitting the parity block for payload length to the receiver.

4. The method of claim 3, wherein the parity block for payload length includes an odd-numbered parity block generated by encoding an odd-numbered source block including odd-numbered length fields and an even-numbered parity block generated by encoding an even-numbered source block including even-numbered length fields, and
   the odd-numbered source block and the even-numbered source block are encoded using an encoding scheme equal to that used for encoding the symbol block.

5. The method of claim 3, wherein the at least one packet is generated according to a predetermined packet format and then transmitted, and a packet comprises a header including an information field of a payload length of a source payload.

6. The method of claim 1, wherein the information field is transmitted in the signaling message separated from the at least one packet.

7. An encoding apparatus in a data communication system, the apparatus comprising:
- a converter configured to identify a source block including a plurality of source payloads, and to generate a symbol block including a plurality of symbol payloads from the source block according to a generation mode from among a plurality of generation modes;
- an encoder configured to encode the symbol block according to an encoding scheme to make at least one packet; and
- a transmitter configured to transmit the at least one packet block to a receiver, and to transmit, to the receiver, a signaling message including an information field indicating the generation mode,
- wherein each of the plurality of generation modes indicates how the symbol block is configured by using the plurality of source payloads included in the source block, and
- wherein, in at least one of the plurality of generation modes, the source block is split into a plurality of sub-blocks each including at least one of the plurality of source payloads, at least a portion of a sub-block is included in a symbol payload, and a source payload is placed into at least one symbol payload of the symbol block.

8. The apparatus of claim 7, wherein the plurality of generation modes includes at least one of
- a first generation mode for generating the plurality of symbol payloads equally to the plurality of source payloads in case of that the source block consists of the plurality of source payloads with a same size,
- a second generation mode for generating the plurality of symbol payloads by adding padding data to at least one of the plurality of source payloads in order to make the plurality of symbol payloads have an equal size in case of that the source block consists of the plurality of source payloads with variable sizes, and
- a third generation mode for dividing the source block into a plurality of sub-blocks each including at least one of the plurality of source payloads, serializing the corresponding source payloads of each sub-block, configuring each byte of the serialized source payloads as one symbol payload, and configuring a last symbol payload of a corresponding sub-block by adding padding data to remaining of the serialized source payloads in case of that the source block consists of the plurality of source payloads with variable sizes.

9. The apparatus of claim 7, wherein the encoder encodes a length source block including length fields of the plurality of source payloads to generate a parity block for payload length, and the transmitter transmits the parity block for payload length to the receiver.

10. The apparatus of claim 9, wherein the parity block for payload length includes an odd-numbered parity block generated by encoding an odd-numbered source block including odd-numbered length fields and an even-numbered parity block generated by encoding an even-numbered source block including even-numbered length fields, and
- the odd-numbered source block and the even-numbered source block are encoded using an encoding scheme equal to that used for encoding the symbol block.

11. The apparatus of claim 9, wherein the encoded symbol block is packetized according to a predetermined packet format and then transmitted, and a packet comprises a header including an information field of a payload length of a source payload.

12. The apparatus of claim 7, wherein the information field is transmitted in the signaling message separated from the at least one packet.

13. A decoding method in a data communication system, the method comprising:
- receiving at least one packet from a transmitter;
- receiving, from the transmitter, a signaling message including an information field indicating a generation mode applied to generation of the at least one packet from among a plurality of generation modes;
- decoding the at least one packet to generate a symbol block including a plurality of symbol payloads; and
- generating a source block including a plurality of source payloads from the symbol block according to the generation mode indicated by the received information field,
- wherein each of the plurality of generation modes indicates how the symbol block is configured by using the plurality of source payloads included in the source block, and
- wherein, in at least one of the plurality of generation modes, the source block is split into a plurality of sub-blocks each including at least one of the plurality of source payloads, at least a portion of a sub-block is included in a symbol payload, and a source payload is placed into at least one symbol payload of the symbol block.

14. The method of claim 13, wherein the plurality of generation modes includes at least one of
- a first generation mode for generating the plurality of symbol payloads equally to the plurality of source payloads in case of that the source block consists of the plurality of source payloads with a same size,
- a second generation mode for generating the plurality of symbol payloads by adding padding data to at least one of the plurality of source payloads in order to make the plurality of symbol payloads have an equal size in case of that the source block consists of the plurality of source payloads with variable sizes, and
- a third generation mode for dividing the source block into a plurality of sub-blocks each including at least one of the plurality of source payloads, serializing the corresponding source payloads of each sub-block, configuring each S bytes of the serialized source payloads as one symbol payload, and configuring a last symbol payload of a corresponding sub-block by adding padding data to remaining of the serialized source payloads in case of that the source block consists of the plurality of source payloads with variable sizes.

15. The method of claim 13, further comprising:
- receiving a parity block for payload length from the transmitter; and
- decoding the parity block for payload length to acquire lengths of the plurality of source payloads.

16. The method of claim 15, wherein the parity block for payload length includes an odd-numbered parity block generated by encoding an odd-numbered source block including odd-numbered length fields and an even-numbered parity block generated by encoding an even-numbered source block including even-numbered length fields, and
- the odd-numbered source block and the even-numbered source block are encoded using an encoding scheme equal to that used for encoding the symbol block.

17. The method of claim 15, wherein each packet comprises a header including an information field of a payload length of a source payload.

18. The method of claim 13, wherein the information field is received in the signaling message separated from the at least one packet.

19. An apparatus in a data communication system, the decoding comprising:
- a receiver configured to receive at least one packet from a transmitter, and to receive, from the transmitter, a signaling message including an information field indicating a generation mode applied to generation of the at least one packet from among of a plurality of generation modes;
- a decoder configured to decode the at least one packet to output a symbol block including a plurality of symbol block payloads; and
- a converter configured to generate a source block including a plurality of source payloads from the symbol block according to the generation mode indicated by the received information field,
- wherein each of the plurality of generation modes indicates how the symbol block is configured by using the plurality of source payloads included in the source block, and
- wherein, in at least one of the plurality of generation modes, the source block is split into a plurality of sub-blocks each including at least one of the plurality of source payloads, at least a portion of a sub-block is included in a symbol payload, and a source payload is placed into at least one symbol payload of the symbol block.

20. The apparatus of claim 19, wherein the plurality of generation modes includes at least one of
- a first generation mode for generating the plurality of symbol payloads equally to the plurality of source payloads in case of that the source block consists of the plurality of source payloads with a same size,
- a second generation mode for generating the plurality of symbol payloads by adding padding data to at least one of the plurality of source payloads in order to make the plurality of symbol payloads have an equal size in case of that the source block consists of the plurality of source payloads with variable sizes, and
- a third generation mode for dividing the source block into a plurality of sub-blocks each including at least one of the plurality of source payloads, serializing the corresponding source payloads of each sub-block, configuring each S bytes of the serialized source payloads as one symbol payload, and configuring a last symbol payload of a corresponding sub-block by adding padding data to remaining of the serialized source payloads in case of that the source block consists of the plurality of source payloads with variable sizes.

21. The apparatus of claim 19, wherein the receiver is further configured to receive a parity block for payload length from the transmitter, and the decoder is further configured to decode the parity block for payload length to acquire lengths of the plurality of source payloads.

22. The apparatus of claim 21, wherein the parity block for payload length includes an odd-numbered parity block generated by encoding an odd-numbered source block including odd-numbered length fields and an even-numbered parity block generated by encoding an even-numbered source block including even-numbered length fields, and
- the odd-numbered source block and the even-numbered source block are encoded using an encoding scheme equal to that used for encoding the symbol block.

23. The apparatus of claim 21, wherein each packet comprises a header including an information field of a payload length of a source payload.

24. The apparatus of claim 19, wherein the information field is received in the signaling message separated from the at least one packet.

* * * * *